(12) United States Patent
Kliner

(10) Patent No.: US 10,971,885 B2
(45) Date of Patent: Apr. 6, 2021

(54) SCALABLE HIGH POWER FIBER LASER

(71) Applicant: nLIGHT, Inc., Vancouver, WA (US)

(72) Inventor: Dahv A. V. Kliner, Portland, OR (US)

(73) Assignee: nLIGHT, Inc., Vancouver, WA (US)

(\*) Notice: Subject to any disclaimer, the term of this patent is extended or adjusted under 35 U.S.C. 154(b) by 350 days.

(21) Appl. No.: 15/912,034

(22) Filed: Mar. 5, 2018

(65) Prior Publication Data

US 2018/0198252 A1 Jul. 12, 2018

Related U.S. Application Data

(63) Continuation of application No. 14/293,941, filed on Jun. 2, 2014, now Pat. No. 10,069,271.

(51) Int. Cl.
*H01S 3/094* (2006.01)
*H01S 3/067* (2006.01)
(Continued)

(52) U.S. Cl.
CPC ...... *H01S 3/094042* (2013.01); *H01S 3/0675* (2013.01); *H01S 3/09408* (2013.01);
(Continued)

(58) Field of Classification Search
CPC ............. H01S 3/094042; H01S 3/0675; H01S 3/094053; H01S 3/08408; H01S 3/09415; G02B 6/4204; G02B 6/04
See application file for complete search history.

(56) References Cited

U.S. PATENT DOCUMENTS 3,388,461 A 6/1968 Lins
4,138,190 A 2/1979 Bryngdahl
(Continued)

FOREIGN PATENT DOCUMENTS

BY 12235 8/2009
CA 2637535 8/2007
(Continued)

OTHER PUBLICATIONS

Argyros et al., "Bend loss in highly multimode fibres," Optics Express, 16:18590-18598 (Nov. 10, 2008).
(Continued)

*Primary Examiner* — Eric L Bolda
(74) *Attorney, Agent, or Firm* — Klarquist Sparkman, LLP

(57) ABSTRACT

A modular and scalable high-power fiber laser system is configurable to generate 1 kW or more of laser output, and includes one or more separable pump modules separately disposed from each other, each pump module including a plurality of fiber-coupled component pump sources optically combined by one or more fiber-based pump module pump combiners, each pump module providing one or more pump module fiber outputs, and a gain module separately disposed from the one or more separable pump modules and including one or more gain module pump fiber inputs optically coupled to corresponding ones of the pump module fiber outputs, and including a gain fiber optically coupled to the one or more gain module pump fiber inputs, the gain fiber configured to generate a gain module fiber output power scalable in relation to the number and power of said pump module fiber outputs coupled to the gain fiber.

12 Claims, 9 Drawing Sheets

(51) Int. Cl.
*H01S 3/0941* (2006.01)
*G02B 6/43* (2006.01)
*H01S 5/40* (2006.01)
*G01B 9/02* (2006.01)

(52) U.S. Cl.
CPC .... *H01S 3/09415* (2013.01); *H01S 3/094053* (2013.01); *H01S 5/4012* (2013.01); *G01B 9/02* (2013.01); *G02B 6/43* (2013.01); *H01S 3/06704* (2013.01); *H01S 3/06754* (2013.01)

(56) References Cited

U.S. PATENT DOCUMENTS

| | | | |
|---|---|---|---|
| 4,252,403 A | 2/1981 | Salisbury | |
| 4,266,851 A | 5/1981 | Salisbury | |
| 4,475,027 A | 10/1984 | Pressley | |
| 4,475,789 A | 10/1984 | Kahn | |
| 4,713,518 A | 12/1987 | Yamazaki et al. | |
| 4,863,538 A | 9/1989 | Deckard | |
| 4,953,947 A | 9/1990 | Bhagavatula | |
| 4,998,797 A | 3/1991 | van den Bergh et al. | |
| 5,008,555 A | 4/1991 | Mundy | |
| 5,082,349 A | 1/1992 | Cordova-Plaza et al. | |
| 5,153,773 A | 10/1992 | Muraki et al. | |
| 5,231,464 A | 7/1993 | Ichimura et al. | |
| 5,237,150 A | 8/1993 | Karube | |
| 5,252,991 A | 10/1993 | Storlie et al. | |
| 5,319,195 A | 6/1994 | Jones et al. | |
| 5,463,497 A | 10/1995 | Muraki et al. | |
| 5,475,415 A | 12/1995 | Noethen | |
| 5,475,704 A | 12/1995 | Lomashevich | |
| 5,566,196 A | 10/1996 | Scifres | |
| 5,684,642 A | 11/1997 | Zumoto et al. | |
| 5,745,284 A | 4/1998 | Goldberg et al. | |
| 5,748,824 A | 5/1998 | Smith | |
| 5,761,234 A | 6/1998 | Craig et al. | |
| 5,818,630 A | 10/1998 | Fermann et al. | |
| 5,864,430 A | 1/1999 | Dickey et al. | |
| 5,903,696 A | 5/1999 | Krivoshlykov | |
| 5,909,306 A | 6/1999 | Goldberg et al. | |
| 5,986,807 A | 11/1999 | Fork | |
| 5,999,548 A | 12/1999 | Mori et al. | |
| 6,072,184 A | 6/2000 | Okino et al. | |
| 6,132,104 A | 10/2000 | Bliss et al. | |
| 6,265,710 B1 | 7/2001 | Miller et al. | |
| 6,275,630 B1 | 8/2001 | Yang et al. | |
| 6,310,995 B1 | 10/2001 | Saini et al. | |
| 6,330,382 B1 | 12/2001 | Harshbarger et al. | |
| RE37,585 E | 3/2002 | Mourou et al. | |
| 6,353,203 B1 | 3/2002 | Hokodate et al. | |
| 6,417,963 B1 | 7/2002 | Ohishi et al. | |
| 6,426,840 B1 | 7/2002 | Partanen et al. | |
| 6,433,301 B1 | 8/2002 | Dunsky et al. | |
| 6,434,177 B1 | 8/2002 | Jurgensen | |
| 6,434,302 B1 | 8/2002 | Fidric et al. | |
| 6,483,973 B1 | 11/2002 | Mazzarese et al. | |
| 6,490,376 B1 | 12/2002 | Au et al. | |
| 6,496,301 B1 | 12/2002 | Koplow et al. | |
| 6,542,665 B2 | 4/2003 | Reed et al. | |
| 6,556,340 B1 | 4/2003 | Wysocki et al. | |
| 6,569,382 B1 | 5/2003 | Edman et al. | |
| 6,639,177 B2 | 10/2003 | Ehrmann et al. | |
| 6,671,293 B2 | 12/2003 | Kopp et al. | |
| 6,711,918 B1 | 3/2004 | Kliner et al. | |
| 6,724,528 B2 | 4/2004 | Koplow et al. | |
| 6,772,611 B2 | 8/2004 | Kliner et al. | |
| 6,777,645 B2 | 8/2004 | Ehrmann et al. | |
| 6,779,364 B2 | 8/2004 | Tankala et al. | |
| 6,801,550 B1 | 10/2004 | Snell et al. | |
| 6,819,815 B1 | 11/2004 | Corbalis et al. | |
| 6,825,974 B2 | 11/2004 | Kliner et al. | |
| 6,839,163 B1 | 1/2005 | Jakobson et al. | |
| 6,882,786 B1 | 4/2005 | Kliner et al. | |
| 6,895,154 B2 | 5/2005 | Johnson et al. | |
| 6,917,742 B2 | 7/2005 | Po | |
| 6,941,053 B2 | 9/2005 | Lauzon et al. | |
| 6,963,062 B2 | 11/2005 | Cyr et al. | |
| 6,989,508 B2 | 1/2006 | Ehrmann et al. | |
| 7,068,900 B2 | 6/2006 | Croteau et al. | |
| 7,079,566 B2 | 7/2006 | Kido et al. | |
| 7,099,533 B1 | 8/2006 | Chenard | |
| 7,099,535 B2 | 8/2006 | Bhagavatula et al. | |
| 7,116,887 B2 | 10/2006 | Farroni et al. | |
| 7,146,073 B2 | 12/2006 | Wan | |
| 7,148,447 B2 | 12/2006 | Ehrmann et al. | |
| 7,151,787 B2 | 12/2006 | Kulp et al. | |
| 7,151,788 B2 | 12/2006 | Imakado et al. | |
| 7,157,661 B2 | 1/2007 | Amako | |
| 7,170,913 B2 | 1/2007 | Araujo et al. | |
| 7,174,078 B2 | 2/2007 | Libori et al. | |
| 7,184,630 B2 | 2/2007 | Kwon et al. | |
| 7,193,771 B1 | 3/2007 | Smith et al. | |
| 7,196,339 B2 | 3/2007 | Namba et al. | |
| 7,218,440 B2 | 5/2007 | Green | |
| 7,235,150 B2 | 6/2007 | Bischel et al. | |
| 7,257,293 B1 | 8/2007 | Fini et al. | |
| 7,317,857 B2 | 1/2008 | Manyam et al. | |
| 7,318,450 B2 | 1/2008 | Nobili | |
| 7,349,123 B2 | 3/2008 | Clarke et al. | |
| 7,359,604 B2 | 4/2008 | Po | |
| 7,373,070 B2 | 5/2008 | Wetter et al. | |
| 7,382,389 B2 | 6/2008 | Cordingley et al. | |
| 7,394,476 B2 | 7/2008 | Cordingley et al. | |
| 7,421,175 B2 | 9/2008 | Varnham | |
| 7,463,805 B2 | 12/2008 | Li et al. | |
| 7,526,166 B2 | 4/2009 | Bookbinder et al. | |
| 7,527,977 B1 | 5/2009 | Fruetel et al. | |
| 7,537,395 B2 | 5/2009 | Savage-Leuchs | |
| 7,592,568 B2 | 9/2009 | Varnham et al. | |
| 7,593,435 B2 | 9/2009 | Gapontsev et al. | |
| 7,622,710 B2 | 11/2009 | Gluckstad | |
| 7,628,865 B2 | 12/2009 | Singh | |
| 7,748,913 B2 | 7/2010 | Oba | |
| 7,764,854 B2 | 7/2010 | Fini | |
| 7,781,778 B2 | 8/2010 | Moon et al. | |
| 7,783,149 B2 | 8/2010 | Fini | |
| 7,835,608 B2 | 11/2010 | Minelly et al. | |
| 7,839,901 B2 | 11/2010 | Meleshkevich et al. | |
| 7,876,495 B1 | 1/2011 | Minelly | |
| 7,880,961 B1 | 2/2011 | Feve et al. | |
| 7,920,767 B2 | 4/2011 | Fini | |
| 7,924,500 B1 | 4/2011 | Minelly | |
| 7,925,125 B2 | 4/2011 | Cyr et al. | |
| 7,955,905 B2 | 6/2011 | Cordingley et al. | |
| 7,955,906 B2 | 6/2011 | Cordingley et al. | |
| 8,027,555 B1 | 9/2011 | Kliner et al. | |
| 8,184,363 B2 | 5/2012 | Rothenberg | |
| 8,217,304 B2 | 7/2012 | Cordingley et al. | |
| 8,243,764 B2 | 8/2012 | Tucker et al. | |
| 8,251,475 B2 | 8/2012 | Murray et al. | |
| 8,269,108 B2 | 9/2012 | Kunishi et al. | |
| 8,270,441 B2 | 9/2012 | Rogers et al. | |
| 8,270,445 B2 | 9/2012 | Morasse et al. | |
| 8,278,591 B2 | 10/2012 | Chouf et al. | |
| 8,288,679 B2 | 10/2012 | Unrath | |
| 8,288,683 B2 | 10/2012 | Jennings et al. | |
| 8,310,009 B2 | 11/2012 | Saran et al. | |
| 8,317,413 B2 | 11/2012 | Fisher et al. | |
| 8,362,391 B2 | 1/2013 | Partlo et al. | |
| 8,395,084 B2 | 3/2013 | Tanaka | |
| 8,404,998 B2 | 3/2013 | Unrath et al. | |
| 8,411,710 B2 | 4/2013 | Tamaoki | |
| 8,415,613 B2 | 4/2013 | Heyn et al. | |
| 8,433,161 B2 | 4/2013 | Langseth et al. | |
| 8,509,577 B2 | 8/2013 | Liu | |
| 8,526,110 B1 | 9/2013 | Honea et al. | |
| 8,537,871 B2 | 9/2013 | Saracco | |
| 8,542,145 B2 | 9/2013 | Galati | |
| 8,542,971 B2 | 9/2013 | Chatigny | |
| 8,593,725 B2 | 11/2013 | Kliner et al. | |
| 8,711,471 B2 | 4/2014 | Liu et al. | |
| 8,728,591 B2 | 5/2014 | Inada et al. | |
| 8,755,649 B2 | 6/2014 | Yilmaz et al. | |
| 8,755,660 B1 | 6/2014 | Minelly | |

(56) References Cited

U.S. PATENT DOCUMENTS

| | | |
|---|---|---|
| 8,774,237 B2 | 7/2014 | Maryashin et al. |
| 8,781,269 B2 | 7/2014 | Huber et al. |
| 8,809,734 B2 | 8/2014 | Cordingley et al. |
| 8,835,804 B2 | 9/2014 | Farmer et al. |
| 8,861,910 B2 | 10/2014 | Yun |
| 8,873,134 B2 | 10/2014 | Price et al. |
| 8,903,211 B2 * | 12/2014 | Fini ................. G02B 6/262 |
| | | 385/50 |
| 8,934,742 B2 | 1/2015 | Voss et al. |
| 8,947,768 B2 | 2/2015 | Kliner et al. |
| 8,948,218 B2 | 2/2015 | Gapontsev et al. |
| 8,953,914 B2 | 2/2015 | Genier |
| 9,014,220 B2 | 4/2015 | Minelly et al. |
| 9,136,663 B2 | 9/2015 | Taya |
| 9,140,873 B2 | 9/2015 | Minelly |
| 9,158,066 B2 | 10/2015 | Fini et al. |
| 9,170,359 B2 | 10/2015 | Van Bommel et al. |
| 9,170,367 B2 | 10/2015 | Messerly et al. |
| 9,207,395 B2 | 12/2015 | Fini et al. |
| 9,217,825 B2 | 12/2015 | Ye et al. |
| 9,250,390 B2 | 2/2016 | Muendel et al. |
| 9,310,560 B2 | 4/2016 | Chann et al. |
| 9,322,989 B2 | 4/2016 | Fini et al. |
| 9,325,151 B1 | 4/2016 | Fini et al. |
| 9,339,890 B2 | 5/2016 | Woods et al. |
| 9,366,887 B2 | 6/2016 | Tayebati et al. |
| 9,397,466 B2 | 7/2016 | McComb et al. |
| 9,431,786 B2 | 8/2016 | Savage-Leuchs |
| 9,442,252 B2 | 9/2016 | Genier |
| 9,482,821 B2 | 11/2016 | Huber et al. |
| 9,496,683 B1 | 11/2016 | Kanskar |
| 9,507,084 B2 | 11/2016 | Fini et al. |
| 9,547,121 B2 | 1/2017 | Hou et al. |
| 9,634,462 B2 | 4/2017 | Kliner et al. |
| 9,823,422 B2 | 11/2017 | Muendel et al. |
| 9,837,783 B2 | 12/2017 | Kliner et al. |
| 10,048,661 B2 | 8/2018 | Arthur et al. |
| 10,112,262 B2 | 10/2018 | Cheverton et al. |
| 10,207,489 B2 | 2/2019 | Dave et al. |
| 10,295,845 B2 | 5/2019 | Kliner et al. |
| 10,310,201 B2 | 6/2019 | Kliner et al. |
| 10,423,015 B2 | 9/2019 | Kliner et al. |
| 2002/0097963 A1 | 7/2002 | Ukechi et al. |
| 2002/0146202 A1 | 10/2002 | Reed et al. |
| 2002/0147394 A1 | 10/2002 | Ellingsen |
| 2002/0158052 A1 | 10/2002 | Ehrmann et al. |
| 2002/0159685 A1 | 10/2002 | Cormack |
| 2002/0168139 A1 | 11/2002 | Clarkson et al. |
| 2002/0176676 A1 | 11/2002 | Johnson et al. |
| 2002/0181512 A1 | 12/2002 | Wang et al. |
| 2003/0031407 A1 | 2/2003 | Weisberg et al. |
| 2003/0032204 A1 | 2/2003 | Walt et al. |
| 2003/0043384 A1 | 3/2003 | Hill |
| 2003/0059184 A1 | 3/2003 | Tankala et al. |
| 2003/0095578 A1 | 5/2003 | Kopp et al. |
| 2003/0118305 A1 | 6/2003 | Reed et al. |
| 2003/0152342 A1 | 8/2003 | Wang et al. |
| 2003/0174387 A1 | 9/2003 | Eggleton et al. |
| 2003/0213998 A1 | 11/2003 | Hsu et al. |
| 2003/0219208 A1 | 11/2003 | Kwon et al. |
| 2004/0013379 A1 | 1/2004 | Johnson et al. |
| 2004/0086245 A1 | 5/2004 | Farroni et al. |
| 2004/0112634 A1 | 6/2004 | Tanaka et al. |
| 2004/0126059 A1 | 7/2004 | Bhagavatula et al. |
| 2004/0208464 A1 | 10/2004 | Po |
| 2005/0002607 A1 | 1/2005 | Neuhaus et al. |
| 2005/0017156 A1 | 1/2005 | Ehrmann |
| 2005/0027288 A1 | 2/2005 | Oyagi et al. |
| 2005/0041697 A1 | 2/2005 | Seifert et al. |
| 2005/0105854 A1 * | 5/2005 | Dong ................. H01S 3/06754 |
| | | 385/46 |
| 2005/0185892 A1 | 8/2005 | Kwon et al. |
| 2005/0191017 A1 | 9/2005 | Croteau et al. |
| 2005/0233557 A1 | 10/2005 | Tanaka et al. |
| 2005/0259944 A1 | 11/2005 | Anderson et al. |
| 2005/0265678 A1 | 12/2005 | Manyam et al. |
| 2005/0271340 A1 | 12/2005 | Weisberg et al. |
| 2006/0013532 A1 | 1/2006 | Wan |
| 2006/0024001 A1 | 2/2006 | Kobayashi |
| 2006/0054606 A1 | 3/2006 | Amako |
| 2006/0067632 A1 | 3/2006 | Broeng et al. |
| 2006/0219673 A1 | 10/2006 | Varnham et al. |
| 2006/0291788 A1 | 12/2006 | Po |
| 2007/0026676 A1 | 2/2007 | Li et al. |
| 2007/0041083 A1 | 2/2007 | Di Teodoro et al. |
| 2007/0047066 A1 | 3/2007 | Green |
| 2007/0075060 A1 | 4/2007 | Shedlov et al. |
| 2007/0104436 A1 | 5/2007 | Li et al. |
| 2007/0104438 A1 | 5/2007 | Varnham |
| 2007/0147751 A1 | 6/2007 | Fini |
| 2007/0178674 A1 | 8/2007 | Imai et al. |
| 2007/0195850 A1 | 8/2007 | Schluter et al. |
| 2007/0215820 A1 | 9/2007 | Cordingley et al. |
| 2007/0251543 A1 | 11/2007 | Singh |
| 2007/0280597 A1 * | 12/2007 | Nakai ................. G02B 6/2835 |
| | | 385/43 |
| 2008/0037604 A1 | 2/2008 | Savage-Leuchs |
| 2008/0124022 A1 | 5/2008 | Ivtsenkov |
| 2008/0141724 A1 | 6/2008 | Fuflyigin |
| 2008/0154249 A1 | 6/2008 | Cao |
| 2008/0181567 A1 | 7/2008 | Bookbinder et al. |
| 2008/0231939 A1 | 9/2008 | Gluckstad |
| 2009/0034059 A1 | 2/2009 | Fini |
| 2009/0052849 A1 | 2/2009 | Lee et al. |
| 2009/0059353 A1 | 3/2009 | Fini |
| 2009/0080472 A1 | 3/2009 | Yao et al. |
| 2009/0080835 A1 | 3/2009 | Frith |
| 2009/0122377 A1 | 5/2009 | Wagner |
| 2009/0127477 A1 | 5/2009 | Tanaka et al. |
| 2009/0129237 A1 | 5/2009 | Chen et al. |
| 2009/0152247 A1 | 6/2009 | Jennings et al. |
| 2009/0154512 A1 | 6/2009 | Simons et al. |
| 2009/0175301 A1 | 7/2009 | Li et al. |
| 2009/0297108 A1 | 12/2009 | Ushiwata et al. |
| 2009/0297140 A1 | 12/2009 | Heismann et al. |
| 2009/0324233 A1 | 12/2009 | Samartsev et al. |
| 2010/0067013 A1 | 3/2010 | Howieson et al. |
| 2010/0067555 A1 | 3/2010 | Austin et al. |
| 2010/0067860 A1 | 3/2010 | Ikeda et al. |
| 2010/0116794 A1 | 5/2010 | Taido et al. |
| 2010/0129029 A1 | 5/2010 | Westbrook |
| 2010/0150186 A1 | 6/2010 | Mizuuchi |
| 2010/0163537 A1 | 7/2010 | Furuta et al. |
| 2010/0187409 A1 | 7/2010 | Cristiani et al. |
| 2010/0230665 A1 | 9/2010 | Verschuren et al. |
| 2010/0251437 A1 | 9/2010 | Heyn et al. |
| 2010/0303419 A1 | 12/2010 | Benjamin et al. |
| 2011/0032602 A1 | 2/2011 | Rothenberg |
| 2011/0058250 A1 | 3/2011 | Liu et al. |
| 2011/0091155 A1 * | 4/2011 | Yilmaz ................. H01S 3/10015 |
| | | 385/30 |
| 2011/0134512 A1 * | 6/2011 | Ahn ................. H01S 3/06754 |
| | | 359/341.3 |
| 2011/0163077 A1 | 7/2011 | Partlo et al. |
| 2011/0243161 A1 | 10/2011 | Tucker et al. |
| 2011/0248005 A1 | 10/2011 | Briand et al. |
| 2011/0253668 A1 | 10/2011 | Winoto et al. |
| 2011/0278277 A1 | 11/2011 | Stork Genannt Wersborg |
| 2011/0297229 A1 | 12/2011 | Gu et al. |
| 2011/0305249 A1 | 12/2011 | Gapontsev et al. |
| 2011/0305256 A1 * | 12/2011 | Chann ................. G02B 27/0905 |
| | | 372/75 |
| 2011/0316029 A1 | 12/2011 | Maruyama et al. |
| 2012/0002919 A1 | 1/2012 | Liu |
| 2012/0051084 A1 | 3/2012 | Yalin et al. |
| 2012/0051692 A1 | 3/2012 | Seo |
| 2012/0082410 A1 | 4/2012 | Peng et al. |
| 2012/0093461 A1 | 4/2012 | Ramachandran |
| 2012/0127097 A1 | 5/2012 | Gaynor et al. |
| 2012/0127563 A1 | 5/2012 | Farmer et al. |
| 2012/0128294 A1 | 5/2012 | Voss et al. |
| 2012/0148823 A1 | 6/2012 | Chu |
| 2012/0156458 A1 | 6/2012 | Chu |
| 2012/0168411 A1 | 7/2012 | Farmer et al. |

(56) References Cited

U.S. PATENT DOCUMENTS

| | | |
|---|---|---|
| 2012/0219026 A1 | 8/2012 | Saracco et al. |
| 2012/0262781 A1 | 10/2012 | Price et al. |
| 2012/0267345 A1 | 10/2012 | Clark et al. |
| 2012/0301733 A1 | 11/2012 | Eckert et al. |
| 2012/0301737 A1 | 11/2012 | Labelle et al. |
| 2012/0321262 A1 | 12/2012 | Goell et al. |
| 2012/0329974 A1 | 12/2012 | Inada et al. |
| 2013/0023086 A1 | 1/2013 | Chikama et al. |
| 2013/0027648 A1 | 1/2013 | Moriwaki |
| 2013/0038923 A1 | 2/2013 | Jespersen et al. |
| 2013/0044768 A1* | 2/2013 | Ter-Mikirtychev ............ H01S 3/0092 372/5 |
| 2013/0087694 A1 | 4/2013 | Creeden et al. |
| 2013/0095260 A1 | 4/2013 | Bovatsek et al. |
| 2013/0134637 A1 | 5/2013 | Wiesner et al. |
| 2013/0146569 A1 | 6/2013 | Woods et al. |
| 2013/0148925 A1 | 6/2013 | Muendel et al. |
| 2013/0182725 A1 | 7/2013 | Karlsen et al. |
| 2013/0202264 A1 | 8/2013 | Messerly et al. |
| 2013/0223792 A1 | 8/2013 | Huber et al. |
| 2013/0228442 A1 | 9/2013 | Mohaptatra et al. |
| 2013/0251324 A1 | 9/2013 | Fini et al. |
| 2013/0272657 A1 | 10/2013 | Salokatve |
| 2013/0299468 A1 | 11/2013 | Unrath et al. |
| 2013/0301300 A1 | 11/2013 | Duerksen et al. |
| 2013/0308661 A1 | 11/2013 | Nishimura et al. |
| 2013/0343703 A1 | 12/2013 | Genier |
| 2014/0044143 A1 | 2/2014 | Clarkson et al. |
| 2014/0086526 A1 | 3/2014 | Starodubov et al. |
| 2014/0177038 A1 | 6/2014 | Rrataj et al. |
| 2014/0178023 A1 | 6/2014 | Oh et al. |
| 2014/0205236 A1 | 7/2014 | Noguchi et al. |
| 2014/0233900 A1 | 8/2014 | Hugonnot et al. |
| 2014/0241385 A1* | 8/2014 | Fomin ............ G02B 6/4296 372/6 |
| 2014/0259589 A1 | 9/2014 | Xu et al. |
| 2014/0263209 A1 | 9/2014 | Burris et al. |
| 2014/0268310 A1 | 9/2014 | Ye et al. |
| 2014/0271328 A1 | 9/2014 | Burris et al. |
| 2014/0313513 A1 | 10/2014 | Liao |
| 2014/0319381 A1 | 10/2014 | Gross |
| 2014/0334788 A1 | 11/2014 | Fini et al. |
| 2015/0049987 A1 | 2/2015 | Grasso et al. |
| 2015/0096963 A1 | 4/2015 | Bruck et al. |
| 2015/0104139 A1 | 4/2015 | Brunet et al. |
| 2015/0125114 A1 | 5/2015 | Genier |
| 2015/0125115 A1 | 5/2015 | Genier |
| 2015/0138630 A1 | 5/2015 | Honea et al. |
| 2015/0165556 A1 | 6/2015 | Jones et al. |
| 2015/0217402 A1 | 8/2015 | Hesse et al. |
| 2015/0241632 A1 | 8/2015 | Chann et al. |
| 2015/0270089 A1 | 9/2015 | Ghanea-Hercock |
| 2015/0283613 A1 | 10/2015 | Backlund et al. |
| 2015/0293300 A1 | 10/2015 | Fini et al. |
| 2015/0293306 A1 | 10/2015 | Huber et al. |
| 2015/0314612 A1 | 11/2015 | Balasini et al. |
| 2015/0316716 A1 | 11/2015 | Fini et al. |
| 2015/0325977 A1 | 11/2015 | Gu et al. |
| 2015/0331205 A1 | 11/2015 | Tayebati et al. |
| 2015/0349481 A1 | 12/2015 | Kliner |
| 2015/0372445 A1 | 12/2015 | Harter |
| 2015/0378184 A1 | 12/2015 | Tayebati et al. |
| 2016/0013607 A1 | 1/2016 | McComb et al. |
| 2016/0052162 A1 | 2/2016 | Colin et al. |
| 2016/0059354 A1 | 3/2016 | Sercel et al. |
| 2016/0097903 A1 | 4/2016 | Li et al. |
| 2016/0104995 A1 | 4/2016 | Savage-Leuchs |
| 2016/0114431 A1 | 4/2016 | Cheverton et al. |
| 2016/0116679 A1 | 4/2016 | Muendel et al. |
| 2016/0158889 A1 | 6/2016 | Carter et al. |
| 2016/0179064 A1 | 6/2016 | Arthur et al. |
| 2016/0207111 A1 | 7/2016 | Robrecht et al. |
| 2016/0218476 A1 | 7/2016 | Kliner et al. |
| 2016/0285227 A1 | 9/2016 | Farrow et al. |
| 2016/0294150 A1 | 10/2016 | Johnson |
| 2016/0320565 A1 | 11/2016 | Brown et al. |
| 2016/0320685 A1 | 11/2016 | Tayebati et al. |
| 2016/0369332 A1 | 12/2016 | Rothberg et al. |
| 2017/0003461 A1 | 1/2017 | Tayebati et al. |
| 2017/0090119 A1 | 3/2017 | Logan et al. |
| 2017/0090462 A1 | 3/2017 | Dave et al. |
| 2017/0110845 A1 | 4/2017 | Hou et al. |
| 2017/0120537 A1 | 5/2017 | DeMuth et al. |
| 2017/0162999 A1 | 6/2017 | Saracco et al. |
| 2017/0271837 A1 | 9/2017 | Hemenway et al. |
| 2017/0293084 A1 | 10/2017 | Zhou et al. |
| 2017/0336580 A1 | 11/2017 | Tayebati et al. |
| 2017/0363810 A1 | 12/2017 | Holland et al. |
| 2018/0059343 A1 | 3/2018 | Kliner |
| 2018/0088355 A1 | 3/2018 | Kliner et al. |
| 2018/0088357 A1 | 3/2018 | Kliner et al. |
| 2018/0088358 A1 | 3/2018 | Kliner et al. |
| 2018/0154484 A1 | 6/2018 | Hall |
| 2018/0203185 A1 | 7/2018 | Farrow et al. |
| 2018/0215650 A1 | 8/2018 | Brown et al. |
| 2019/0258091 A1 | 8/2019 | Kliner et al. |

FOREIGN PATENT DOCUMENTS

| | | |
|---|---|---|
| CN | 1212056 | 3/1999 |
| CN | 1584644 | 2/2005 |
| CN | 1617003 | 5/2005 |
| CN | 1327254 | 7/2007 |
| CN | 101435918 | 5/2009 |
| CN | 101907742 A | 12/2010 |
| CN | 102007653 | 4/2011 |
| CN | 102481664 | 5/2012 |
| CN | 101907742 B | 7/2012 |
| CN | 102621628 | 8/2012 |
| CN | 102782540 | 11/2012 |
| CN | 102844942 | 12/2012 |
| CN | 103056513 | 4/2013 |
| CN | 103097931 | 5/2013 |
| CN | 103173760 | 6/2013 |
| CN | 103262367 | 8/2013 |
| CN | 103490273 | 1/2014 |
| CN | 103521920 | 1/2014 |
| CN | 103606803 | 2/2014 |
| CN | 103999302 | 8/2014 |
| CN | 104136952 | 11/2014 |
| CN | 104169763 | 11/2014 |
| CN | 104999670 | 10/2015 |
| CN | 105383060 | 3/2016 |
| DE | 3833992 | 4/1990 |
| DE | 4200587 | 4/1993 |
| DE | 203 20 269 | 4/2004 |
| DE | 10321102 | 12/2004 |
| DE | 60312826 | 1/2008 |
| DE | 102009026526 | 12/2010 |
| DE | 102013205029 | 9/2014 |
| DE | 102013215362 | 2/2015 |
| DE | 102013017792 | 4/2015 |
| DE | 202016004237 | 8/2016 |
| DE | 102015103127 | 9/2016 |
| EP | 0366856 | 5/1990 |
| EP | 0731743 | 9/1996 |
| EP | 1681542 | 7/2006 |
| EP | 1800700 | 6/2007 |
| EP | 1266259 | 5/2011 |
| EP | 2587564 | 5/2013 |
| EP | 2642246 | 9/2013 |
| EP | 2886226 | 6/2015 |
| JP | H02220314 | 9/1990 |
| JP | H06-297168 | 10/1994 |
| JP | H11780 | 1/1999 |
| JP | H11-287922 | 10/1999 |
| JP | H11-344636 | 12/1999 |
| JP | 2003-129862 | 5/2003 |
| JP | 2003200286 | 7/2003 |
| JP | 2004291031 | 10/2004 |
| JP | 2005/070608 | 3/2005 |
| JP | 2006-45584 | 2/2006 |
| JP | 2006-098085 | 4/2006 |

(56) References Cited

FOREIGN PATENT DOCUMENTS

| | | |
|---|---|---|
| JP | 2009-142866 | 7/2009 |
| JP | 2009-248157 | 10/2009 |
| JP | 2012-059920 | 3/2012 |
| JP | 2012-528011 | 11/2012 |
| JP | 2016-201558 | 12/2016 |
| RU | 2008742 | 2/1994 |
| RU | 2021881 | 10/1994 |
| RU | 68715 | 11/2007 |
| RU | 2365476 | 8/2009 |
| RU | 2528287 | 9/2014 |
| RU | 2015112812 | 10/2016 |
| WO | WO 1995/011100 | 4/1995 |
| WO | WO 1995/011101 | 4/1995 |
| WO | WO 2003/044914 | 5/2003 |
| WO | WO 2004/027477 | 4/2004 |
| WO | WO 2008/053915 | 5/2008 |
| WO | WO 2009/155536 | 12/2009 |
| WO | WO 2010/029243 | 3/2010 |
| WO | WO 2011/124671 | 10/2011 |
| WO | WO 2011/146407 | 11/2011 |
| WO | WO 2012/165389 | 5/2012 |
| WO | WO 2012/102655 | 8/2012 |
| WO | WO 2013/090236 | 6/2013 |
| WO | WO 2014/074947 | 5/2014 |
| WO | WO 2014/154901 | 10/2014 |
| WO | WO 2014/179345 | 11/2014 |
| WO | WO 2014/180870 | 11/2014 |
| WO | WO 2015/156281 | 10/2015 |
| WO | WO 2015/189883 | 12/2015 |
| WO | WO 2016/061657 | 4/2016 |
| WO | WO 2017/008022 | 1/2017 |
| WO | WO 2017/136831 | 8/2017 |

OTHER PUBLICATIONS

Andreasch et al., "Two concentric fiber diameters in one laser light cable," Optical Components, No. 1, pp. 38-41 (Jan. 2011).
Bai et al., "Effect of Bimodal Powder Mixture on Powder Packing Density and Sintered Density in Binder Jetting of Metals," 26th Annual International Solid Freeform Fabrication Symposium, 14 pages (Aug. 10-12, 2015).
Balazic, "Additive Manufacturing and 3D Printing LENS Technology," Additive Manufacturing of Metal Components Conference at IK4-Lortek, 52 pages (Nov. 27, 2013).
"Bending Machine," CBC Alta Technologia Italiana, General Catalog, pp. 96-97 (2011).
Brown et al., "Fundamentals of Laser-Material Interaction and Application to Multiscale Surface Modification," Chapter 4, Laser Precision Microfabrication, pp. 91-120 (2010).
"Business Unit Laser Ablation and Cutting: Laser Beam Fusion Cutting with Dynamic Beam Shaping," Fraunhofer IWS Annual Report 2015, pp. 86-87 (2015).
Dorrington et al., "A simple microcontroller based digital lock-in amplifier for the detection of low level optical signals," Proceedings of the First IEEE International Workshop on Electronic Design, Test and Applications (DELTA '02), 3 pages (2002).
Duflou et al., "Development of a Real Time Monitoring and Adaptive Control System for Laser Flame Cutting," ICALEO 2009, 527, 10 pages published online Sep. 27, 2018.
"Enhanced LENS Thermal Imaging Capabilities Introduced by Optomec," Optomec, 4 pages (Jan. 8, 2013).
Examiner-Initiated Interview Summary from U.S. Appl. No. 15/607,410, dated Jan. 31, 2019, 2 pages.
Fini, "Bend distortion in large-mode-area amplifier fiber design," Proc. of SPIE, 6781:67810E-1-67810E-11 (Nov. 21, 2007).
Goppold et al., "Dynamic Beam Shaping Improves Laser Cutting of Thick Steel Plates," Industrial Photonics, 4:18-19 (Jul. 2017).
Heider et al., "Process Stabilization at welding Copper by Laser Power Modulation," Physics Procedia, 12:81-87 (2011).
Herwig et al., "Possibilities of power modulation and dynamic beam shaping," Fraunhofer IWS presentation, 6 pages, retrieved on Mar. 16, 2018.

Ivanov et al., "Fiber-Optic Bend Sensor Based on Double Cladding Fiber," Journal of Sensors, 2015, 6 pages (2015).
Ivanov et al., "Fiber structure based on a depressed inner cladding fiber for bend, refractive index and temperature sensing," Meas. Sci. Technol., 25:1-8 (2014).
Jacobs, "Suggested Guidelines for the Handling of Optical Fiber," White Paper, Corning Incorporated, pp. 1-8 (Dec. 2001).
Jollivet, "Specialty Fiber Lasers and Novel Fiber Devices," Doctoral Dissertation, University of Central Florida, 213 pages (2014).
Jollivet et al., "Advances in Multi-Core Fiber Lasers," Latin America Optics and Photonics Conference, OSA Technical, 4 pages (Nov. 2014).
Khairallah et al, "Laser power-bed fusion additive manufacturing: Effects of main physical processes on dynamical melt flow and pore formation from mesoscopic powder simulation," Lawrence Livermore National Laboratory, 26 pages (Aug. 20, 2015).
Martins et al., "Modeling of Bend Losses in Single-Mode Optical Fibers," 7th Conference on Telecommunications, 4 pages (Jan. 2009).
Messerly et al., "Field-flattened, ring-like propagation modes," Optics Express, 21:12683-12698 (May 16, 2013).
Messerly et al., "Patterned flattened modes," Optics Letters, 38:3329-3332 (Sep. 1, 2013).
Nazemosadat et al., "Saturable absorption in multicore fiber couplers," J. Opt. Soc. Am. B, 30:2787-2790 (Nov. 2013).
Neilson et al., "Free-space optical relay for the interconnection of multimode fibers," Applied Optics, 38:2291-2296 (Apr. 10, 1999).
Neilson et al., "Plastic modules for free-space optical interconnects," Applied Optics, 37:2944-2952 (May 10, 1998).
Salceda-Delgado et al., "Compact fiber-optic curvature sensor based on super-mode interference in a seven-core fiber," Optics Letters, 40:1468-1471 (Apr. 1, 2015).
Sateesh et al., "Effect of Process Parameters on Surface Roughness of Laser Processed Inconel Superalloy," International Journal of Scientific & Engineering Research, 5:232-236 (Aug. 2014).
Tam et al., "An imaging fiber-based optical tweezer array for microparticle array assembly," Appl. Phys. Lett., 84:4289-4291 (May 7, 2004).
"UNI 42 A," Curvatubi elettrica digitale, 5 pages (2016).
"UNI 60 COMBI 2," Frame-Grab of YouTube Video, 1 page (Sep. 26, 2011).
Villatoro et al., "Ultrasensitive vector bending sensor based on multicore optical fiber," Optics Letters, 41:832-835 (Feb. 15, 2016).
Wang et al., "Mechanisms and characteristics of spatter generation in SLM processing and its effect on the properties," Materials & Design, 117(5):121-130 (Mar. 5, 2017).
Zhang et al., "Switchable multiwavelength fiber laser by using a compact in-fiber Mach-Zehnder interferometer," J. Opt., 14:1-5 (2012).
Zlodeev et al., "Transmission spectra of a double-clad fibre structure under bending," Quantum Electronics, 48:535-541 (2013).
Eichenholz, "Photonic-crystal fibers have many uses," Optoelectronics World, 4 pages (Aug. 2004).
Final Office action from U.S. Appl. No. 15/607,399, dated May 3, 2018, 31 pages.
Final Office action from U.S. Appl. No. 15/607,410, dated May 11, 2018, 29 pages.
First Office Action for related Chinese Application No. 201610051671.X, dated Jun. 4, 2018, 25 pages (w/ English translation).
Injeyan et al., "Introduction to Optical Fiber Lasers," High-Power Laser Handbook, pp. 436-439 (2011).
"Lasers & Fibers," NKT Photonics, available at: https://www.nktphotonics.com/lasers-fibers/technology/photonic-crystal-fibers/, 4 pages, retrieved Feb. 13, 2018.
Russell, "Photonic-Crystal Fibers," IEEE JLT, 24:4729-4749 (Dec. 2006).
Saleh et al., "Chapter 9.4 Holey and Photonic-Crystal Fibers," Fundamentals of Photonics, Second Edition, pp. 359-362 (2007).
Wetter et al., "High power cladding light strippers," Proc. of SPIE, 6873:687327-1-687327-8 (Jan. 21, 2008).
Advisory Action from U.S. Appl. No. 15/607,410, dated Sep. 24, 2018, 6 pages.

(56) References Cited

OTHER PUBLICATIONS

AlMangour et al., "Scanning strategies for texture and anisotropy tailoring during selective laser melting of TiC/316L stainless steel nanocomposites," *Journal of Alloys and Compounds*, 728:424-435 (Aug. 5, 2017).
Anastasiadi et al., "Fabrication and characterization of machined multi-core fiber tweezers for single cell manipulation," Optics Express, 26:3557-3567 (Feb. 5, 2018).
Applicant-Initiated Interview Summary from U.S. Appl. No. 15/607,399, dated May 25, 2018, 3 pages.
Applicant-Initiated Interview Summary from U.S. Appl. No. 15/607,399, dated Jul. 27, 2018, 9 pages.
Applicant-Initiated Interview Summary from U.S. Appl. No. 15/607,410, dated May 25, 2018, 3 pages.
Applicant-Initiated Interview Summary from U.S. Appl. No. 15/607,410, dated Jul. 24, 2018, 9 pages.
Applicant-Initiated Interview Summary from U.S. Appl. No. 15/607,411, dated Jan. 17, 2018, 2 pages.
Applicant-Initiated Interview Summary from U.S. Appl. No. 15/607,411, dated Sep. 12, 2018, 17 pages.
Applicant-Initiated Interview Summary from U.S. Appl. No. 15/607,399, dated Dec. 26, 2018, 7 pages.
Ayoola, "Study of Fundamental Laser Material Interaction Parameters in Solid and Powder Melting," Ph.D. Thesis, Cranfield University, 192 pages (May 2016).
Barron et al., "Dual-beam interference from a lensed multicore fiber and its application to optical trapping," *Optics Express*, 20:23156-23161 (Oct. 8, 2012).
Barron et al., "Optical Trapping using a Lensed Multicore Fiber," Workshop on Specialty Optical Fibers and their Applications, OSA 2013, 2 pages (2013).
Bergmann et al., "Effects of diode laser superposition on pulsed laser welding of aluminum," *Physics Procedia*, 41:180-189 (2013).
Bertoli et al., "On the limitations of Volumetric Energy Density as a design parameter for Selective Laser Melting," Materials and Design, 113:331-340 (Oct. 19, 2016).
Birks et al., "The photonic lantern," Advances in Optics and Photonics, 7:107-167 (2015).
Burger et al., "Implementation of a spatial light modulator for intracavity beam shaping," *J. Opt.*, 17:1-7, (2015).
"Canunda, Application Note," CAILabs, available at: www.cailabs.com, 16 pages (Jun. 10, 2015).
"Canunda, Application Note: Flexible high-power laser beam shaping," CAILabs, available at: www.cailabs.com, 22 pages, date unknown (cited by the Examiner in a related U.S. Appl. No. 15/607,399).
Caprio, "Investigation of emission modes in the SLM of AISI 316L: modelling and process diagnosis," Ph.D. Thesis, Polytechnic University of Milan, 3 pages (Apr. 28, 2017).—Abstract only.
Chen et al., "Improving additive manufacturing processability of hard-to-process overhanging structure by selective laser melting," *Journal of Materials Processing Tech.*, 250:99-108 (Jul. 1, 2017).
Chung, "Solution-Processed Flexible Transparent Conductors Composed of Silver Nanowire Networks Embedded in Indium Tin Oxide Nanoparticle Matrices," Nano Research, 10 pages (Sep. 24, 2012).
Cloots et al., "Investigations on the microstructure and crack formation of IN738LC samples processed by selective laser melting using Gaussian and doughnut profiles," *Materials and Design*, 89:770-784 (2016).
DebRoy et al., "Additive manufacturing of metallic components—Process, structure and properties," Progress in Materials Science, 92:112-224 (2018).
Decombe et al., "Single and dual fiber nano-tip optical tweezers: trapping and analysis," Optics Express, 21:30521-30531 (Dec. 4, 2013).
Dehoff et al., "Site specific control of crystallographic grain orientation through electron beam additive manufacturing," *Materials Science and Technology*, 31:931-938 (2015).

Demir et al., "From pulsed to continuous wave emission in SLM with contemporary fiber laser sources: effect of temporal and spatial pulse overlap in part quality," *Int. J. Adv. Manuf. Technol.*, 91:2701-2714 (Jan. 10, 2017).
Deng et al., "Annular arrayed-waveguide fiber for autofocusing Airy-like beams," Optics Letters, 41:824-827 (Feb. 15, 2016).
Dezfoli et al., "Determination and controlling of grain structure of metals after laser incidence: Theoretical approach," *Scientific Reports*, 7:1-11 (Jan. 30, 2017).
Drobczynski et al., "Real-time force measurement in double wavelength optical tweezers," Journal of the Optical Society of America B, 34:38-43 (Jan. 2017).
Duocastella et al., "Bessel and annular beams for materials processing," Laser Photonics Rev. 6, pp. 607-621 (2012).
European Search Report for related Application No. 18173438.5, 3 pages, dated Oct. 5, 2018.
Faidel et al., "Improvement of selective laser melting by beam shaping and minimized thermally induced effects in optical systems," 9th International Conference on Photonic Technologies LANE 2016, pp. 1-4 (2016).
Farley et al., "Optical fiber designs for beam shaping," Proc. of SPIE, Fiber Lasers XI: Technology, Systems, and Applications, 8961:89612U-1-89612U-10 (2014).
Fermann, "Single-mode excitation of multimode fibers with ultrashort pulses," Optics Letters, 23:52-54 (Jan. 1, 1998).
Fey, "3D Printing and International Security," PRIF Report No. 144, 47 pages (2017).
First Office Action for related Chinese Application No. 201510468218.4, dated Dec. 4, 2018, 14 pages (with English translation).
Florentin et al., "Shaping the light amplified in a multimode fiber," *Official Journal of the CIOMP, Light: Science & Applications*, 6:1-9 (Feb. 24, 2017).
Francis, "The Effects of Laser and Electron Beam Spot Size in Additive Manufacturing Processes," Ph.D. Thesis, Carnegie Mellon University, 191 pages (May 2017).
Fuchs et al., "Beam shaping concepts with aspheric surfaces," *Proc. of SPIE*, 9581:95810L-1-95810L-7 (Aug. 25, 2015).
Fuse, "Beam Shaping for Advanced Laser Materials Processing," *Laser Technik Journal*, pp. 19-22 (Feb. 2015).
Garcia et al., "Fast adaptive laser shaping based on multiple laser incoherent combining," Proc. of SPIE, 10097:1009705-1-1009705-15 (Feb. 22, 2017).
Gardner, "Precision Photolithography on Flexible Substrates," http://azorescorp.com/downloads/Articles/AZORESFlexSubstrate.pdf (prior to Jan. 30, 2013).
Ghouse et al., "The influence of laser parameters and scanning strategies on the mechanical properties of a stochastic porous material," *Materials and Design*, 131:498-508 (2017).
Gissibl et al., "Sub-micrometre accurate free-form optics by three-dimensional printing on single-mode fibres," Nature Communications, 7:1-9 (Jun. 24, 2016).
Gockel et al., "Integrated melt pool and microstructure control for Ti-6Al-4V thin wall additive manufacturing," *Materials Science and Technology*, 31:912-916 (Nov. 3, 2014).
Grigoriyants et al., "Tekhnologicheskie protsessy lazernoy obrabotki," Moscow, izdatelstvo MGTU im. N.E. Baumana, p. 334 (2006).
Gris-Sanchez et al., "The Airy fiber: an optical fiber that guides light diffracted by a circular aperture," Optica, 3:270-276 (Mar. 2016).
Gunenthiram et al., "Analysis of laser-melt pool-powder bed interaction during the selective laser melting of a stainless steel," *Journal of Laser Applications*, 29:022303-1-022303-8 (May 2017).
Gupta, "A Review on Layer Formation Studies in Selective Laser Melting of Steel Powders and Thin Wall Parts Using Pulse Shaping," *International Journal of Manufacturing and Material Processing*, 3:9-15 (2017).
Hafner et al., "Tailored laser beam shaping for efficient and accurate microstructuring," *Applied Physics A*, 124:111-1-111-9 (Jan. 10, 2018).
Han et al., "Selective laser melting of advanced Al—$Al_2O_3$ nanocomposites: Simulation, microstructure and mechanical properties," *Materials Science & Engineering A*, 698:162-173, (May 17, 2017).

(56) References Cited

OTHER PUBLICATIONS

Hansen et al., "Beam shaping to control of weldpool size in width and depth," *Physics Procedia*, 56:467-476 (2014).
Hauschild, "Application Specific Beam Profiles—New Surface and Thin-Film Refinement Processes using Beam Shaping Technologies," *Proc. of SPIE*, 10085:100850J-1-100850J-9 (Feb. 22, 2017).
Hebert, "Viewpoint: metallurgical aspects of powder bed metal additive manufacturing," J. Mater. Sci., 51:1165-1175 (Nov. 18, 2015).
Heck, "Highly integrated optical phased arrays: photonic integrated circuits for optical beam shaping and beam steering," Nanophotonics, 6:93-107 (2017).
Hengesbach et al., "Brightness and average power as driver for advancements in diode lasers and their applications," Proc. SPIE, 9348, 18 pages (2015).
Hester et al., "Tunable optical tweezers for wavelength-dependent measurements," Review of Scientific Instruments, 83:043114-1-043114-8 (2012).
Huang et al., "3D printing optical engine for controlling material microstructure," *Physics Procedia*, 83:847-853 (2016).
Huang et al., "All-fiber mode-group-selective photonic lantern using graded-index multimode fibers," *Optics Express*, 23:224-234 (Jan. 6, 2015).
International Search Report and Written Opinion for International Application No. PCT/US2016/063086, 6 pages, dated Mar. 23, 2017.
International Search Report and Written Opinion from International Application No. PCT/US2018/015768, dated Jun. 11, 2018, 15 pages.
International Search Report and Written Opinion from International Application No. PCT/US2018/016305, dated Jun. 11, 2018, 10 pages.
International Search Report and Written Opinion from International Application No. PCT/US2018/016288, dated Jun. 11, 2018, 10 pages.
International Search Report and Written Opinion from International Application No. PCT/US2018/024145, dated Jun. 21, 2018, 5 pages.
International Search Report and Written Opinion from International Application No. PCT/US2018/015710, dated Jun. 25, 2018, 17 pages.
International Search Report and Written Opinion from International Application No. PCT/US2018/024548, dated Jun. 28, 2018, 6 pages.
International Search Report and Written Opinion for International Application No. PCT/US2018/015895, dated Jul. 10, 2018, 10 pages.
International Search Report and Written Opinion from International Application No. PCT/US2018/024510, dated Jul. 12, 2018, 6 pages.
International Search Report and Written Opinion for International Application No. PCT/US2018/024944, dated Jul. 12, 2018, 8 pages.
International Search Report and Written Opinion from International Application No. PCT/US2018/024974, dated Jul. 12, 2018, 6 pages.
International Search Report and Written Opinion from International Application No. PCT/US2018/024908, dated Jul. 19, 2018, 8 pages.
International Search Report and Written Opinion from International Application No. PCT/US2018/022629, dated Jul. 26, 2018, 11 pages.
International Search Report and Written Opinion for International Application No. PCT/US2018/023944, dated Aug. 2, 2018, 7 pages.
International Search Report and Written Opinion for International Application No. PCT/US2018/026110, 12 pages, dated Aug. 8, 2018.
International Search Report and Written Opinion from International Application No. PCT/US2018/023012, dated Aug. 9, 2018, 7 pages.
International Search Report and Written Opinion for International Application No. PCT/US2018/023963, dated Aug. 9, 2018, 7 pages.
International Search Report and Written Opinion for International Application No. PCT/US2018/024899, dated Aug. 9, 2018, 7 pages.
International Search Report and Written Opinion for International Application No. PCT/US2018/024955, dated Aug. 9, 2018, 8 pages.
International Search Report and Written Opinion for International Application No. PCT/US2018/024953, dated Aug. 16, 2018, 8 pages.
International Search Report and Written Opinion from International Application No. PCT/US2018/024954, dated Aug. 23, 2018, 7 pages.
International Search Report and Written Opinion from International Application No. PCT/US2018/024958, dated Aug. 23, 2018, 6 pages.
International Search Report and Written Opinion from International Application No. PCT/US2018/024227, dated Aug. 30, 2018, 7 pages.
International Search Report and Written Opinion from International Application No. PCT/US2018/024904, dated Aug. 30, 2018, 5 pages.
International Search Report and Written Opinion from International Application No. PCT/US2018/024971, dated Aug. 30, 2018, 8 pages.
International Search Report and Written Opinion from International Application No. PCT/US2018/024907, dated Sep. 27, 2018, 6 pages.
Jain et al., "Multi-element fiber technology for space-division multiplexing applications," *Optics Express*, 22:3787-3796 (Feb. 11, 2014).
Ji et al., "Meta-q-plate for complex beam shaping," *Scientific Reports*, 6:1-7 (May 6, 2016).
Jin et al., "Mode Coupling Effects in Ring-Core Fibers for Space-Division Multiplexing Systems," *Journal of Lightwave Technology*, 34:3365-3372 (Jul. 15, 2016).
Kaden et al., "Selective laser melting of copper using ultrashort laser pulses," Lasers in Manufacturing Conference 2017, pp. 1-5 (2017).
Kaden et al., "Selective laser melting of copper using ultrashort laser pulses," Applied Physics A, 123:596-1-596-6 (Aug. 24, 2017).
Keicher et al., "Advanced 3D Printing of Metals and Electronics using Computational Fluid Dynamics," Solid Freeform Fabrication Symposium, 32 pages (Aug. 2015).
Khijwania et al., "Propagation characteristics of single-mode graded-index elliptical core linear and nonlinear fiber using super-Gaussian approximation," *Applied Optics*, 48:G156-G162 (Nov. 1, 2009).
King et al., "Observation of keyhole-mode laser melting in laser powder-bed fusion additive manufacturing," *Journal of Materials Processing Technology*, 214:2915-2925 (2014).
Klerks et al., "Flexible beam shaping system for the next generation of process development in laser micromachining," 9th International Conference on Photonic Technologies LANE 2016, pp. 1-8 (2016).
Kosolapov et al., "Hollow-core revolver fibre with a double-capillary reflective cladding," Quantum Electronics, 46:267-270 (2016).
Krupa et al., "Spatial beam self-cleaning in multimode fiber," available at: https://arxiv.org/abs/1603.02972v1, 8 pages (Mar. 9, 2016).
Kruth et al., "On-line monitoring and process control in selective laser melting and laser cutting," *Proceedings of the 5th Lane Conference, laser Assisted Net Shape Engineering*, vol. 1, 14 pages, (Sep. 1, 2007).
Laskin et al., "Applying of refractive spatial beam shapers with scanning optics," ICALEO, Paper M604, pp. 941-947 (2011).
Laskin et al., "Beam shaping to generate uniform "Laser Light Sheet" and Linear Laser Spots," Proc. of SPIE, The International Society for Optical Engineering, 13 pages (Sep. 2013).
Lee et al., "FEM Simulations to Study the Effects of Laser Power and Scan Speed on Molten Pool Size in Additive Manufacturing," *International Journal of Mechanical and Mechatronics Engineering*, 11:1291-1295 (2017).
Lee et al., "Use of the Coaxial-Core Profile in the Erbium-Doped Fiber Amplifier for Self-Regulation of Gain Spectrum," IEICE Trans. Commun., E82-B:1273-1282 (Aug. 1999).
Li et al., "High-quality near-field beam achieved in a high-power laser based on SLM adaptive beam-shaping system," *Optics Express*, 23:681-689 (Jan. 12, 2015).

(56) References Cited

OTHER PUBLICATIONS

Li et al., "Melt-pool motion, temperature variation and dendritic morphology of Inconel 718 during pulsed—and continuous-wave laser additive manufacturing: A comparative study," *Materials and Design*, 119:351-360 (Jan. 23, 2017).
Litvin et al., "Beam shaping laser with controllable gain," *Appl. Phys. B*, 123:174-1-174-5 (May 24, 2017).
Liu et al., "Femtosecond laser additive manufacturing of YSZ," *Appl. Phys. A*, 123:293-1-293-8 (Apr. 1, 2017).
Malinauskas et al., "Ultrafast laser processing of materials: from science to industry," *Official Journal of the CIOMP, Light: Science & Applications*, 5:1-14 (2016).
Masoomi et al., "Quality part production via multi-laser additive manufacturing," *Manufacturing Letters*, 13:15-20 (May 27, 2017).
Matthews et al., "Diode-based additive manufacturing of metals using an optically-addressable light valve," *Optics Express*, 25:11788-11800 (May 15, 2017).
Meier et al., "Thermophysical Phenomena in Metal Additive Manufacturing by Selective Laser Melting: Fundamentals, Modeling, Simulation and Experimentation," available at: http://arxiv.org/pdf/1709.09510v1, pp. 1-59 (Sep. 4, 2017).
Morales-Delgado et al., "Three-dimensional microfabrication through a multimode optical fiber," available at: http://arxiv.org, 20 pages (2016).
Morales-Delgado et al., "Three-dimensional microfabrication through a multimode optical fiber," *Optics Express*, 25:7031-7045 (Mar. 20, 2017).
Mumtaz et al., "Selective Laser Melting of thin wall parts using pulse shaping," *Journal of Materials Processing Technology*, 210:279-287 (2010).
Naidoo et al., "Improving the laser brightness of a commercial laser system," *Proc. of SPIE*, 10036:100360V-1-100360V-8 (Feb. 3, 2017).
Ngcobo et al., "A digital laser for on-demand laser modes," *Nature Communications*, 4:1-6 (Aug. 2, 2013).
Ngcobo et al., "The digital laser," available at: http://arxiv.org, pp. 1-9 (2013).
Notice of Allowance and Examiner-Initiated Interview Summary from U.S. Appl. No. 15/607,411, dated Jan. 7, 2019, 14 pages.
Office action from U.S. Appl. No. 15/074,838, dated May 19, 2017, 12 pages.
Office action from U.S. Appl. No. 15/607,411, dated Jun. 12, 2018, 19 pages.
Office action from U.S. Appl. No. 15/607,399, dated Sep. 14, 2018, 19 pages.
Office action and Applicant-Initiated Interview Summary from U.S. Appl. No. 15/607,410, dated Dec. 31, 2018, 63 pages.
Office action from U.S. Appl. No. 15/938,959, dated Jul. 18, 2018, 6 pages.
Office action from U.S. Appl. No. 15/939,064, dated Jul. 27, 2018, 7 pages.
Office action from U.S. Appl. No. 15/939,064, dated Oct. 5, 2018, 22 pages.
Office action from U.S. Appl. No. 15/938,959, dated Oct. 5, 2018, 22 pages.
Okunkova et al., "Development of laser beam modulation assets for the process productivity improvement of selective laser melting," *Procedia IUTAM*, 23:177-186 (2017).
Okunkova et al., "Experimental approbation of selective laser melting of powders by the use of non-Gaussian power density distributions," *Physics Procedia*, 56:48-57 (2014). (2017).
Okunkova et al., "Study of laser beam modulation influence on structure of materials produced by additive manufacturing," *Adv. Mater. Lett.*, 7:111-115 (2016).
Olsen, "Laser metal cutting with tailored beam patterns," available at: https://www.industrial-lasers.com/articles/print/volume-26/issue-5/features/laser-metal-cutting-with-tailored-beam-patterns.html, 8 pages (Sep. 1, 2011).
"Optical Tweezers & Micromanipulation: Applications Hamamatsu Photonics," available at: http://www.hamamatsu.com/jp/en/community/lcos/aplications/optical.html, archived: Mar. 27, 2015, 3 pages.
Pinkerton, "Lasers in Additive Manufacturing," *Optics & Laser Technology*, 78:25-32 (2016).
Prashanth et al., "Is the energy density a reliable parameter for materials synthesis by selective laser melting?" *Mater. Res. Lett.*, 5:386-390 (2017).
Purtonen, et al., "Monitoring and Adaptive Control of Laser Processes," Physics Procedia, Elsevier, Amsterdam, NL, 56(9):1218-1231 (Sep. 9, 2014).
Putsch et al., "Active optical system for advanced 3D surface structuring by laser remelting," *Proc. of SPIE*, 9356:93560U-1-93560U-10 (Mar. 9, 2015).
Putsch et al., "Active optical system for laser structuring of 3D surfaces by remelting," *Proc. of SPIE*, 8843:88430D-1-88430D-8 (Sep. 28, 2013).
Putsch et al., "Integrated optical design for highly dynamic laser beam shaping with membrane deformable mirrors," *Proc. of SPIE*, 10090:1009010-1-1009010-8 (Feb. 20, 2017).
Raghavan et al., "Localized melt-scan strategy for site specific control of grain size and primary dendrite arm spacing in electron beam additive manufacturing," *Acta Materialia*, 140:375-387 (Aug. 30, 2017).
Rashid et al., "Effect of scan strategy on density and metallurgical properties of 17-4PH parts printed by Selective Laser Melting (SLM)," *Journal of Materials Processing Tech.*, 249:502-511 (Jun. 19, 2017).
Ren et al., "Resonant coupling in trenched bend-insensitive optical fiber," Optics Letters, 38:781-783 (Mar. 1, 2013).
Roehling et al., "Modulating laser intensity profile ellipticity for microstructural control during metal additive manufacturing," Acta Materialia, 128:197-206 (2017).
Rosales-Guzman et al., "Multiplexing 200 modes on a single digital hologram," available at: http://arxiv.org/pdf/1706.06129v1, pp. 1-14 (Jun. 19, 2017).
Saint-Pierre et al., "Fast uniform micro structuring of DLC surfaces using multiple ultrashort laser spots through spatial beam shaping," Physics Procedia, 83:1178-1183 (2016).
Sames et al., "The metallurgy and processing science of metal additive manufacturing," International Materials Reviews, pp. 1-46 (2016).
Schulze et al., "Mode Coupling in Few-Mode Fibers Induced by Mechanical Stress," *Journal of Lightwave Technology*, 33:4488-4496 (Nov. 1, 2015).
SeGall et al., "Simultaneous laser mode conversion and beam combining using multiplexed volume phase elements," Advanced Solid-State Lasers Congress Technical Digest, Optical Society of America, paper AW2A.9, 3 pages (Oct. 27-Nov. 1, 2013).
Shusteff et al., "One-step volumetric additive manufacturing of complex polymer structures," *Sci. Adv.*, 3:1-7 (Dec. 8, 2017).
Skutnik et al., "Optical Fibers for Improved Low Loss Coupling of Optical Components," Proc. of SPIE, Photon Processing in Microelectronics and Photnics III, 6 pages (Jul. 15, 2004).
Smith et al., "Tailoring the thermal conductivity of the powder bed in Electron Beam Melting (EBM) Additive Manufacturing," *Scientific Reports*, 7:1-8 (Sep. 5, 2017).
Spears et al., "In-process sensing in selective laser melting (SLM) additive manufacturing," *Integrating Materials and Manufacturing Innovation*, 5:2-25 (2016).
Sundqvist et al., "Analytical heat conduction modelling for shaped laser beams," *Journal of Materials Processing Tech.*, 247:48-54 (Apr. 18, 2017).
Thiel et al., "Reliable Beam Positioning for Metal-based Additive Manufacturing by Means of Focal Shift Reduction," Lasers in Manufacturing Conference 2015, 8 pages (2015).
Tofail et al., "Additive manufacturing: scientific and technological challenges, market uptake and opportunities," Materials Today, pp. 1-16 (2017).
Trapp et al., "In situ absorptivity measurements of metallic powders during laser powder-bed fusion additive manufacturing," Applied Materials Today, 9:341-349 (2017).

(56) References Cited

OTHER PUBLICATIONS

Ulmanen, "The Effect of High Power Adjustable Ring Mode Fiber Laser for Material Cutting," M.S. Thesis, Tampere University of Technology, 114 pages (May 2017).
Van Newkirk et al., "Bending sensor combining multicore fiber with a mode-selective photonic lantern," *Optics Letters*, 40:5188-5191 (Nov. 15, 2015).
Valdez et al., "Induced porosity in Super Alloy 718 through the laser additive manufacturing process: Microstructure and mechanical properties," *Journal of Alloys and Compounds*, 725:757-764 (Jul. 22, 2017).
Wang et al., "Selective laser melting of W—Ni—Cu composite powder: Densification, microstructure evolution and nanocrystalline formation," *International Journal of Refractory Metals & Hard Materials*, 70:9-18 (Sep. 9, 2017).
Website describing 3-Axis Laser Scanning Systems at http://www.camtech.com/index.php?option=com_content&view=article&id=131&Itemid=181, 4 pages, accessed Dec. 31, 2014.
Wilson-Heid et al., "Quantitative relationship between anisotropic strain to failure and grain morphology in additively manufactured Ti—6Al—4V," *Materials Science & Engineering A*, 706:287-294 (Sep. 6, 2017).
Wischeropp et al., "Simulation of the effect of different laser beam intensity profiles on heat distribution in selective laser melting," Laser in Manufacturing Conference 2015, 10 pages (2015).
Xiao et al., "Effects of laser modes on Nb segregation and Laves phase formation during laser additive manufacturing of nickel-based superalloy," *Materials Letters*, 188:260-262 (Nov. 1, 2016).
Xu et al, "The Influence of Exposure Time on Energy Consumption and Mechanical Properties of SLM-fabricated Parts," 2017 Annual International Solid Freeform Fabrication Symposium, 7 pages (2017)—Abstract only.
Yan et al., "Formation mechanism and process optimization of nano $Al_2O_3$—$ZrO_2$ eutectic ceramic via laser engineered net shaping (LENS)," *Ceramics International*, 43:1-6 (2017).
Ye et al., "Mold-free fs laser shock micro forming and its plastic deformation mechanism," *Optics and Lasers in Engineering*, 67:74-82 (2015).
Yu, "Laser Diode Beam Spatial Combining," Ph.D. Thesis, Politecnico di Torino, 106 pages (Jun. 6, 2017).
Yu et al., "Development of a 300 W 105/0.15 fiber pigtailed diode module for additive manufacturing applications," *Proc. of SPIE*, 10086:100860A-1-100860A-5 (Feb. 22, 2017).
Yu et al., "Laser material processing based on non-conventional beam focusing strategies," 9th International Conference on Photonic Technologies LANE 2016, pp. 1-10 (2016).
Yusuf et al., "Influence of energy density on metallurgy and properties in metal additive manufacturing," *Materials Science and Technology*, 33:1269-1289 (Feb. 15, 2017).
Zavala-Arredondo et al., "Diode area melting single-layer parametric analysis of 316L stainless steel powder," *Int. J. Adv. Manuf. Technol.*, 94:2563-2576 (Sep. 14, 2017).
Zavala-Arredondo et al., "Laser diode area melting for high speed additive manufacturing of metallic components," *Materials and Design*, 117:305-315 (Jan. 3, 2017).
Zheng et al., "Bending losses of trench-assisted few-mode optical fibers," Applied Optics, 55:2639-2648 (Apr. 1, 2016).
Zhirnov et al., "Laser beam profiling: experimental study of its influence on single-track formation by selective laser melting," *Mechanics & Industry*, 16:709-1-709-6 (2015).
Zhu et al., "Effect of processing parameters on microstructure of laser solid forming Inconel 718 superalloy," *Optics and Laser Technology*, 98:409-415 (Sep. 5, 2017).
Zhu et al., "Gaussian beam shaping based on multimode interference," Proc. of SPIE, Laser Resonators and Beam Control XII, 7579:75790M-1-75790M-11 (2010).
Zou et al., "Adaptive laser shock micro-forming for MEMS device applications," Optics Express, 25:3875-3883 (Feb. 20, 2017).
Adelman et al., "Measurement of Relative State-to-State Rate Constants for the Reaction $D+H_2(v, j) \rightarrow HD(v', j')+H$," *J. Chem. Phys.*, 97:7323-7341 (Nov. 15, 1992).
Alfano et al., "Photodissociation and Recombination Dynamics of $I_2^-$ in Solution," *Ultrafast Phenomena VIII*, (Springer-Verlag, New York), pp. 653-655 (Jan. 1993).
"ARM," Coherent, available at: http://www.corelase.fi/products/arm/, 6 pages, retrieved May 26, 2017.
Bernasconi et al., "Kinetics of Ionization of Nitromethane and Phenylnitromethane by Amines and Carboxylate Ions in $Me_2SO$-Water Mixtures. Evidence of Ammonium Ion-Nitronate Ion Hydrogen Bonded Complex Formation in $Me_2SO$-Rich Solvent Mixtures," *J. Org. Chem.*, 53:3342-3351 (Jul. 1988).
Blake et al., "The $H+D_2$ Reaction: HD(v=1, J) and HD(v=2, J) Distributions at a Collision Energy of 1.3 eV," *Chem. Phys. Lett.*, 153:365-370 (Dec. 23, 1988).
Daniel et al., "Novel technique for mode selection in a large-mode-area fiber laser," Conference on Lasers and Electro-Optics 2010, OSA Technical Digest (CD) (Optical Society of America), paper CWC5, 2 pages (Jan. 2010).
Daniel et al., "Novel technique for mode selection in a multimode fiber laser," Optics Express, 19:12434-12439 (Jun. 20, 2011).
Di Teodoro et al., "Diffraction-Limited, 300-kW Peak-Power Pulses from a Coiled Multimode Fiber Amplifier," *Optics Letters*, 27:518-520 (May 2002).
Di Teodoro et al., "Diffraction-limited, 300-kW-peak-power Pulses from a Yb-doped Fiber Amplifier," *Conference on Lasers and Electro-Optics*, OSA Technical Digest (Optical Society of America, Washington, DC), p. 592-593 (May 22-24, 2002).
Di Teodoro et al., "High-peak-power pulsed fiber sources," *Proc. of SPIE*, 5448:561-571 (Sep. 20, 2004).
"Efficient and Simple Precision, Laser Processing Head PDT-B," HIGHYAG, 6 pages, (Jan. 2010).
"ENSIS Series," Amada America, Inc., available at: http://www.amada.com/america/ensis-3015-aj, 2 pages, retrieved May 26, 2017.
"EX-F Series," MC Machinery Systems, Inc., available at: https://www.mcmachinery.com/products-and-solutions/ex-f-series/, 2 pages, retrieved May 26, 2017.
Farrow et al., "Bend-Loss Filtered, Large-Mode-Area Fiber Amplifiers: Experiments and Modeling," Proceedings of the Solid State and Diode Laser Technology Review (Directed Energy Professional Society), P-9, 5 pages (2006).
Farrow et al., "Compact Fiber Lasers for Efficient High-Power Generation," *Proc. of SPIE*, 6287:62870C-1-62870C-6 (Sep. 1, 2006).
Farrow et al., "Design of Refractive-Index and Rare-Earth-Dopant Distributions for Large-Mode-Area Fibers Used in Coiled High-Power Amplifiers," *Proc. of SPIE*, 6453:645310-1-64531C-11 (Feb. 2, 2007).
Farrow et al., "High-Peak-Power (>1.2 MW) Pulsed Fiber Amplifier," *Proc. of the SPIE*, 6102:61020L-1-61020L-11 (Mar. 2006).
Farrow et al., "Numerical Modeling of Self-Focusing Beams in Fiber Amplifiers," *Proc. of the SPIE*, 6453:645309-1-645309-9 (2007).
Farrow et al., "Peak-Power Limits on Pulsed Fiber Amplifiers Imposed by Self-Focusing," *Optics Lett.*, 31:3423-3425 (Dec. 1, 2006).
Fève et al., "Four-wave mixing in nanosecond pulsed fiber amplifiers," *Optics Express*, 15:4647-4662 (Apr. 16, 2007).
Feve et al., "Limiting Effects of Four-Wave Mixing in High-Power Pulsed Fiber Amplifiers," *Proc. of the SPIE*, 6453:64531P-1-64531P-11 (Feb. 22, 2007).
Final Office action from U.S. Appl. No. 15/607,411, dated Feb. 1, 2018, 27 pages.
Fini, "Bend-compensated design of large-mode-area fibers," Optics Letters, 31:1963-1965 (Jul. 1, 2006).
Fini, "Large mode area fibers with asymmetric bend compensation," Optics Express, 19:21868-21873 (Oct. 24, 2011).
Fini et al., "Bend-compensated large-mode-area fibers: achieving robust single-modedness with transformation optics," Optics Express, 21:19173-19179 (Aug. 12, 2013).

(56) References Cited

OTHER PUBLICATIONS

Fox et al., "Effect of low-earth orbit space on radiation-induced absorption in rare-earth-doped optical fibers," *J. Non-Cryst. Solids*, 378:79-88 (Oct. 15, 2013).

Fox et al., "Gamma Radiation Effects in Yb-Doped Optical Fiber," *Proc. of the SPIE*, 6453:645328-1-645328-9 (Feb. 23, 2007).

Fox et al., "Gamma-Radiation-Induced Photodarkening in Unpumped Optical Fibers Doped with Rare-Earth Constituents," *IEEE Trans. on Nuclear Science*, 57:1618-1625 (Jun. 2010).

Fox et al., "Investigation of radiation-induced photodarkening in passive erbium-, ytterbium-, and Yb/Er co-doped optical fibers," *Proc. of the SPIE*, 6713:67130R-167130R-9 (Sep. 26, 2007).

Fox et al., "Radiation damage effects in doped fiber materials," *Proc. of the SPIE*, 6873:68731F-1-68731F-9 (Feb. 22, 2008).

Fox et al., "Spectrally Resolved Transmission Loss in Gamma Irradiated Yb-Doped Optical Fibers," *IEEE J. Quant. Electron.*, 44:581-586 (Jun. 2008).

Fox et al., "Temperature and Dose-Rate Effects in Gamma Irradiated Rare-Earth Doped Fibers," *Proc. of SPIE*, 7095:70950B-1-70950B-8 (Aug. 26, 2008).

Ghasemi et al., "Beam shaping design for coupling high power diode laser stack to fiber," *Applied Optics*, 50:2927-2930 (Jun. 20, 2011).

Ghatak et al., "Design of Waveguide Refractive Index Profile to Obtain Flat Model Field," SPIE, 3666:40-44 (Apr. 1999).

Goers et al., "Development of a Compact Gas Imaging Sensor Employing cw Fiber-Amp-Pumped PPLN OPO," Conference on Lasers and Electro-Optics, OSA Technical Digest (Optical Society of America, Washington, DC), p. 521 (May 11, 2001).

Goldberg et al., "Deep UV Generation by Frequency Tripling and Quadrupling of a High-Power Modelocked Semiconductor Laser," Proceedings of the Quantum Electronics and Laser Science Conference, QPD18-2 (Baltimore) 2 pages (May 1995).

Goldberg et al., "Deep UV Generation by Frequency Quadrupling of a High-Power GaAlAs Semiconductor Laser," *Optics Lett.*, 20:1145-1147 (May 15, 1995).

Goldberg et al., "High Efficiency 3 W Side-Pumped Yb Fiber Amplifier and Laser," *Conference on Lasers and Electro-Optics*, OSA Technical Digest (Optical Society of America, Washington, DC), p. 11-12 (May 24, 1999).

Goldberg et al., "Highly Efficient 4-W Yb-Doped Fiber Amplifier Pumped by a Broad-Stripe Laser Diode," *Optics Lett.*, 24:673-675 (May 15, 1999).

Goldberg et al., "High-Power Superfluorescent Source with a Side-Pumped Yb-Doped Double-Cladding Fiber," *Optics Letters*, 23:1037-1039 (Jul. 1, 1998).

Goldberg et al., "Tunable UV Generation at 286 nm by Frequency Tripling of a High-Power Modelocked Semiconductor Laser," *Optics Lett.*, 20:1640-1642 (Aug. 1, 1995).

Golub, "Laser Beam Splitting by Diffractive Optics," *Optics and Photonics News*, 6 pages (Feb. 2004).

Han et al., "Reshaping collimated laser beams with Gaussian profile to uniform profiles," *Applied Optics*, 22:3644-3647 (Nov. 15, 1983).

Headrick et al., "Application of laser photofragmentation-resonance enhanced multiphoton ionization to ion mobility spectrometry," *Applied Optics*, 49:2204-2214 (Apr. 10, 2010).

Hemenway et al., "Advances in high-brightness fiber-coupled laser modules for pumping multi-kW CW fiber lasers," Proceedings of SPIE, 10086:1008605-1-1008605-7 (Feb. 22, 2017).

Hemenway et al., "High-brightness, fiber-coupled pump modules in fiber laser applications," *Proc. of SPIE*, 8961:89611V-1-89611V-12 (Mar. 7, 2014).

Hoops et al., "Detection of mercuric chloride by photofragment emission using a frequency-converted fiber amplifier," *Applied Optics*, 46:4008-4014 (Jul. 1, 2007).

Hotoleanu et al., "High Order Mode Suppression in Large Mode Area Active Fibers by Controlling the Radial Distribution of the Rare Earth Dopant," *Proc. of the SPIE*, 6102:61021T-1-61021T-8 (Feb. 23, 2006).

"How to Select a Beamsplitter," IDEX—Optics & Photonics Marketplace, available at: https://www.cvilaseroptics.com/file/general/beamSplitters.pdf, 5 pages (Jan. 8, 2014).

Huang et al., "Double-cutting beam shaping technique for high-power diode laser area light source," *Optical Engineering*, 52:106108-1-106108-6 (Oct. 2013).

International Search Report and Written Opinion for related International Application No. PCT/US2016/041526, 6 pages, dated Oct. 20, 2016.

International Search Report and Written Opinion from International Application No. PCT/US2017/034848, dated Nov. 28, 2017, 15 pages.

International Search Report and Written Opinion for related International Application No. PCT/US2016/053807, 6 pages, dated Jan. 19, 2017.

Ishiguro et al., "High Efficiency 4-kW Fiber Laser Cutting Machine," *Rev. Laser Eng.*, 39:680-684 (May 21, 2011).

Johnson et al., "Experimental and Theoretical Study of Inhomogeneous Electron Transfer in Betaine: Comparisons of Measured and Predicted Spectral Dynamics," *Chem. Phys.*, 176:555-574 (Oct. 15, 1993).

Johnson et al., "Ultrafast Experiments on the Role of Vibrational Modes in Electron Transfer," *Pure and Applied Chem.*, 64:1219-1224 (May 1992).

Kliner, "Novel, High-Brightness, Fibre Laser Platform for kW Materials Processing Applications," 2015 European Conference on Lasers and Electro-Optics—European Quantum Electronics Conference (Optical Society of America, 2015), paper CJ_11_2, 1 page (Jun. 21-25, 2015).

Kliner et al., "4-kW fiber laser for metal cutting and welding," *Proc. of SPIE*, 7914:791418-791418-8 (Feb. 22, 2011).

Kliner et al., "Comparison of Experimental and Theoretical Absolute Rates for Intervalence Electron Transfer," *J. Am. Chem. Soc.*, 114:8323-8325 (Oct. 7, 1992).

Kliner et al., "Comparison of Experimental and Theoretical Integral Cross Sections for $D+H_2(v=1, j=1)>HD(v'=1, j')+H$," *J. Chem. Phys.*, 95:1648-1662 (Aug. 1, 1991).

Kliner et al., "$D+H_2(v=1, J=1)$: Rovibronic State to Rovibronic State Reaction Dynamics," *J. Chem. Phys.*, 92:2107-2109 (Feb. 1, 1990).

Kliner et al. "Effect of Indistinguishable Nuclei on Product Rotational Distributions: $H+HI>H_2+I$ reaction$^{a)}$," *J. Chem. Phys.*, 90:4625-4327 (Apr. 15, 1989).

Kliner et al., "Efficient second, third, fourth, and fifth harmonic generation of a Yb-doped fiber amplifier," *Optics Communications*, 210:393-398 (Sep. 15, 2002).

Kliner et al., "Efficient UV and Visible Generation Using a Pulsed Yb-Doped Fiber Amplifier," *Conference on Lasers and Electro-Optics*, OSA Technical Digest (Optical Society of America, Washington, DC), p. CPDC10-1-CPDC10-3 (May 19-22, 2002).

Kliner et al., "Efficient visible and UV generation by frequency conversion of a mode-filtered fiber amplifier," *Proc. of SPIE*, 4974:230-235 (Jul. 3, 2003).

Kliner et al., "Fiber laser allows processing of highly reflective materials," *Industrial Laser Solutions*, 31:1-9 (Mar. 16, 2016).

Kliner et al., "High-Power Fiber Lasers," *Photonics & Imaging Technology*, pp. 2-5 (Mar. 2017).

Kliner et al., "Laboratory Investigation of the Catalytic Reduction Technique for Detection of Atmospheric $NO_y$," *J. Geophys. Res.*, 102:10759-10776 (May 20, 1997).

Kliner et al., "Laser Reflections: How fiber laser users are successfully processing highly reflective metals," Shop Floor Lasers, available at: http://www.shopfloorlasers.com/laser-cutting/fiber/354-laser-reflections, 9 pages (Jan./Feb. 2017).

Kliner et al., "Measurements of Ground-State OH Rotational Energy-Transfer Rates," *J. Chem. Phys.*, 110:412-422 (Jan. 1, 1999).

Kliner et al., "Mode-Filtered Fiber Amplifier," Sandia National Laboratories—Brochure, 44 pages (Sep. 13, 2007).

Kliner et al., "Narrow-Band, Tunable, Semiconductor-Laser-Based Source for Deep-UV Absorption Spectroscopy," *Optics Letters*, 22:1418-1420 (Sep. 15, 1997).

(56) References Cited

OTHER PUBLICATIONS

Kliner et al., "Overview of Sandia's fiber laser program," Proceedings of SPIE—The International Society for Optical Engineering, 6952:695202-1-695202-12 (Apr. 14, 2008).
Kliner et al., "Photodissociation and Vibrational Relaxation of $I_2^-$ in Ethanol," *J. Chem. Phys.*, 98:5375-5389 (Apr. 1, 1993).
Kliner et al., "Photodissociation Dynamics of $I_2^-$ in Solution," *Ultrafast Reaction Dynamics and Solvent Effects*, (American Institute of Physics, New York), pp. 16-35 (Feb. 1994).
Kliner et al., "Polarization-Maintaining Amplifier Employing Double-Clad, Bow-Tie Fiber," *Optics Lett.*, 26:184-186 (Feb. 15, 2001).
Kliner et al., "Power Scaling of Diffraction-Limited Fiber Sources," *Proc. of SPIE*, 5647:550-556 (Feb. 21, 2005).
Kliner et al., "Power Scaling of Rare-Earth-Doped Fiber Sources," *Proc. of SPIE*, 5653:257-261 (Jan. 12, 2005).
Kliner et al., "Product Internal-State Distribution for the Reaction H+HI>$H_2$+I," *J. Chem. Phys.*, 95:1663-1670 (Aug. 1, 1991).
Kliner et al., "The D+$H_2$ Reaction: Comparison of Experiment with Quantum-Mechanical and Quasiclassical Calculations," *Chem. Phys. Lett.*, 166:107-111 (Feb. 16, 1990).
Kliner et al., "The H+para-$H_2$ reaction: Influence of dynamical resonances on $H_2$(v'=1, j'=1 and 3) Integral Cross Sections," *J. Chem. Phys.*, 94:1069-1080 (Jan. 15, 1991).
Koplow et al., "A New Method for Side Pumping of Double-Clad Fiber Sources," *J. Quantum Electronics*, 39:529-540 (Apr. 4, 2003).
Koplow et al., "Compact 1-W Yb-Doped Double-Cladding Fiber Amplifier Using V-Groove Side-Pumping," *IEEE Photonics Technol. Lett.*, 10:793-795 (Jun. 1998).
Koplow et al., "Development of a Narrowband, Tunable, Frequency-Quadrupled Diode Laser for UV Absorption Spectroscopy," *Appl. Optics*, 37:3954-3960 (Jun. 20, 1998).
Koplow et al., "Diode-Bar Side-Pumping of Double-Clad Fibers," *Proc. of SPIE*, 5709:284-300 (Apr. 22, 2005).
Koplow et al., "High Power PM Fiber Amplifier and Broadband Source," *Optical Fiber Communication Conference*, OSA Technical Digest (Optical Society of America, Washington, DC), p. 12-13 (Mar. 7-10, 2000).
Koplow et al., "Polarization-Maintaining, Double-Clad Fiber Amplifier Employing Externally Applied Stress-Induced Birefringence," *Optics Lett.*, 25:387-389 (Mar. 15, 2000).
Koplow et al., "Single-mode operation of a coiled multimode fiber amplifier," Optics Letters, 25:442-444 (Apr. 1, 2000).
Koplow et al., "Use of Bend Loss to Obtain Single-Transverse-Mode Operation of a Multimode Fiber Amplifier," *Conference on Lasers and Electro-Optics*, OSA Technical Digest (Optical Society of America, Washington, DC), p. 286-287 (May 7-12, 2000).
Koplow et al., "UV Generation by Frequency Quadrupling of a Yb-Doped Fiber Amplifier," *IEEE Photonics Technol. Lett.*, 10:75-77 (Jan. 1998).
Koponen et al., "Photodarkening Measurements in Large-Mode-Area Fibers," *Proc. of SPIE*, 6453:64531E-1-64531E-12 (Feb. 2007).
Kotlyar et al., "Asymmetric Bessel-Gauss beams," J. Opt. Soc. Am. A, 31:1977-1983 (Sep. 2014).
Kulp et al., "The application of quasi-phase-matched parametric light sources to practical infrared chemical sensing systems," *Appl. Phys. B*, 75:317-327 (Jun. 6, 2002).
"Laser cutting machines," TRUMPF, available at: http://www.us.trumpf.com/en/products/machine-tools/products/2d-laser-cutting/innovative-technology/brightline.html, 9 pages, retrieved May 26, 2017.
Longhi et al., "Self-focusing and nonlinear periodic beams in parabolic index optical fibres," J. Opt. B: Quantum Semiclass. Opt., 6:S303-S308 (May 2004).
Maechling et al., "Sum Frequency Spectra in the C—H Stretch Region of Adsorbates on Iron," *Appl. Spectrosc.*, 47:167-172 (Feb. 1, 1993).
McComb et al., "Pulsed Yb:fiber system capable of >250 kW peak power with tunable pulses in the 50 ps to 1.5 ns range," *Proc. of SPIE*, 8601:86012T-1-86012T-11 (Mar. 23, 2013).

Moore et al., "Diode-bar side pumping of double-clad fibers," *Proc. of SPIE*, 6453:64530K-1-64530K-9 (Feb. 20, 2007).
Neuhauser et al., "State-to-State Rates for the D+$H_2$(v=1, j=1)>HD(v', j')+H Reaction: Predictions and Measurements," *Science*, 257:519-522 (Jul. 24, 1992).
Office action from U.S. Appl. No. 15/607,399, dated Sep. 20, 2017, 25 pages.
Office action from U.S. Appl. No. 15/607,411, dated Sep. 26, 2017, 15 pages.
Office action from U.S. Appl. No. 15/607,410, dated Oct. 3, 2017, 32 pages.
Price et al., "High-brightness fiber-coupled pump laser development," *Proc. of SPIE*, 7583:758308-1-758308-7 (Feb. 2010).
Rinnen et al., "Construction of a Shuttered Time-of-Flight Mass Spectrometer for Selective Ion Detection," *Rev. Sci. Instrum.*, 60:717-719 (Apr. 1989).
Rinnen et al., "Effect of Indistinguishable Nuclei on Product Rotational Distributions: D+DI>$D_2$+I," *Chem. Phys. Lett.*, 169:365-371 (Jun. 15, 1990).
Rinnen et al. "Quantitative Determination of HD Internal State Distributions via (2+1) REMPI," *Isr. J. Chem.*, 29:369-382 (Mar. 7, 1989).
Rinnen et al., "Quantitative determination of $H_{2,\ HD,\ and\ D2}$ internal state distributions via (2+1) resonance-enhanced multiphoton ionization," *J. Chem. Phys.*, 95:214-225 (Jul. 1, 1991).
Rinnen et al., "The H+$D_2$ Reaction: "Prompt" HD Distributions at High Collision Energies," *Chem. Phys. Lett.*, 153:371-375 (Dec. 23, 1988).
Rinnen et al., "The H+$D_2$ Reaction: Quantum State Distributions at Collision Energies of 1.3 and 0.55 eV," *J. Chem. Phys.*, 91:7514-7529 (Dec. 15, 1989).
Romero et al., "Lossless laser beam shaping," *J. Opt. Soc. Am. A*, 13:751-760 (Apr. 1996).
Sanchez-Rubio et al., "Wavelength Beam Combining for Power and Brightness Scaling of Laser Systems," *Lincoln Laboratory Journal*, 20:52-66 (Aug. 2014).
Saracco et al., "Compact, 17 W average power, 100 kW peak power, nanosecond fiber laser system," *Proc. of SPIE*, 8601:86012U-1-86012U-13 (Mar. 22, 2013).
Schrader et al., "Fiber-Based Laser with Tunable Repetition Rate, Fixed Pulse Duration, and Multiple Wavelength Output," *Proc. of the SPIE*, 6453:64530D-1-64530D-9 (Feb. 20, 2007).
Schrader et al., "High-Power Fiber Amplifier with Widely Tunable Repetition Rate, Fixed Pulse Duration, and Multiple Output Wavelengths," *Optics Express*, 14:11528-11538 (Nov. 27, 2006).
Schrader et al., "Power scaling of fiber-based amplifiers seeded with microchip lasers," *Proc. of the SPIE*, 6871:68710T-1-68710T-11 (Feb. 2008).
Sheehan et al., "Faserlaser zur Bearbeitung hochreflektierender Materialien (Fiber laser processing of highly reflective materials)," *Laser*, 3:92-94 (Jun. 2017).
Sheehan et al. "High-brightness fiber laser advances remote laser processing," *Industrial Laser Solutions*, 31:1-9 (Nov. 2, 2016).
Sun et al., "Optical Surface Transformation: Changing the optical surface by homogeneous optic-null medium at will," *Scientific Reports*, 5:16032-1-16032-20 (Oct. 30, 2015).
Tominaga et al., "Femtosecond Experiments and Absolute Rate Calculations on Intervalence Electron Transfer in Mixed-Valence Compounds," *J. Chem. Phys.*, 98:1228-1243 (Jan. 15, 1993).
Tominaga et al., "Ultrafast Studies of Intervalence Charge Transfer," *Ultrafast Phenomena VIII*, (Springer-Verlag, New York), pp. 582-584 (1993).
"Triple Clad Ytterbium-Doped Polarization Maintaining Fibers," nuFERN Driven to Light Specifications, 1 page (Jan. 2006).
Varshney et al., "Design of a flat field fiber with very small dispersion slope," Optical Fiber Technology, 9(3):189-198 (Oct. 2003).
Xiao et al., "Fiber coupler for mode selection and high-efficiency pump coupling," Optics Letters, 38:1170-1172 (Apr. 1, 2013).
Yaney et al., "Distributed-Feedback Dye Laser for Picosecond UV and Visible Spectroscopy," *Rev. Sci. Instrum*, 71:1296-1305 (Mar. 2000).

(56) References Cited

OTHER PUBLICATIONS

Yu et al., "1.2-kW single-mode fiber laser based on 100-W high-brightness pump diodes," *Proc. of SPIE*, 8237:82370G-1-82370G-7 (Feb. 16, 2012).

* cited by examiner

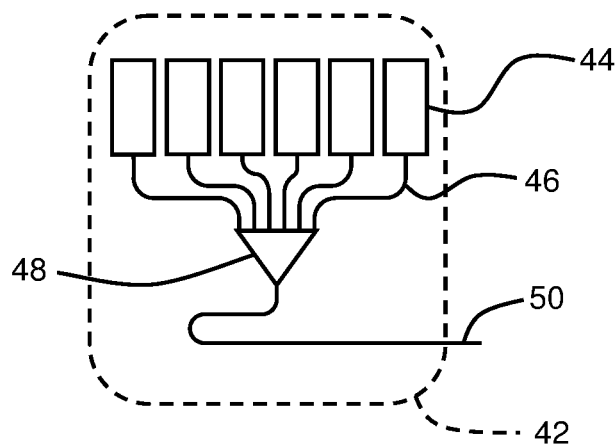 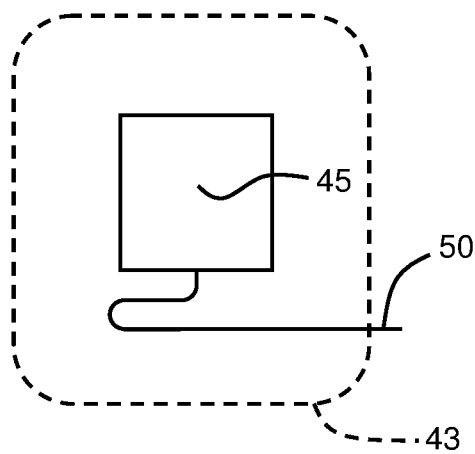
FIG. 3A  FIG. 3B
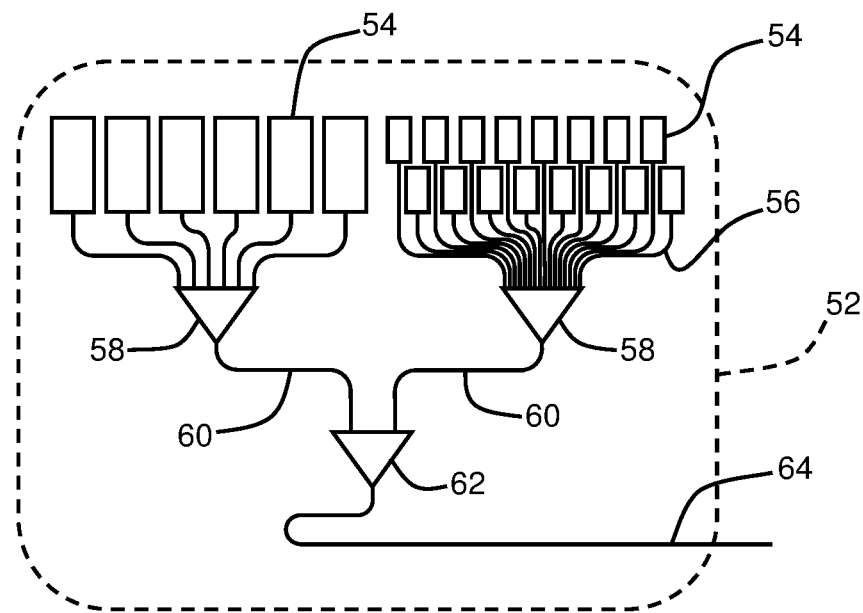
FIG. 4

SCALABLE HIGH POWER FIBER LASER

CROSS REFERENCE TO RELATED APPLICATION

This application is a continuation of U.S. patent application Ser. No. 14/293,941, filed Jun. 2, 2014, which incorporated by reference herein in its entirety.

FIELD

Generally, the field of the present invention is high power fiber lasers. More particularly, the present invention relates to scalable high power continuous-wave and quasi-continuous-wave fiber lasers.

BACKGROUND

Conventional multi-kilowatt industrial fiber laser systems typically employ a non-scalable architecture consisting of multiple component fiber lasers whose outputs are combined with a fused-fiber signal combiner. The total fiber laser system output power is typically in the range of 2 to 6 kW, and the individual component fiber lasers typically have a power in the range of 0.4 to 1.0 kW. Thus, in order to reach total powers in excess of 1 kW, the outputs from multiple fiber lasers (typically two to ten) must be combined.

Such conventional approaches for achieving a high power fiber laser output have several drawbacks made apparent in light of the present disclosure. For example, by combining the multiple individual fiber laser systems significant redundancy is required in optical, electrical, and mechanical components, thereby increasing the system cost, size, and complexity. In addition, fiber laser component systems generally have limited field serviceability, often requiring replacement of the entire fiber laser component system if an optical component thereof fails. Such entire replacement occurs even when the optical component failure is localized to only a portion of the fiber component system, such as a broken fiber. Requiring the replacement of entire fiber laser component systems increases cost for repair of the complete multi-kilowatt system. Field replacement of a fiber laser component system typically requires highly specialized equipment and clean-room conditions, which are not readily available in factory environments, making service costly and disruptive.

The fused-fiber signal combiner causes optical loss and diminishes the beam quality of the individual fiber laser outputs received. This loss negatively impacts efficiency, which determines power consumption and waste-heat generation, and beam quality degradation can reduce the speed in metal-cutting applications. Furthermore, the signal combiner is expensive, requiring costly equipment and considerable process development and control for fabrication, and it can experience unpredictable variation impacting reproducibility and reliability. Fused-fiber signal combiners are also subject to operational damage, including from optical feedback from the work piece, thereby decreasing system reliability.

Utilizing a signal combiner to achieve up to a few kilowatts of power also limits the ability for laser power of the fiber laser system to be upgraded in the field. For example, a fused signal combiner may include empty ports for receiving additional component fiber lasers. However, the beam quality of output beam is degraded whether or not the extra ports are populated with additional component fiber laser system outputs. Also, if the signal combiner has fully populated input ports, upgrading system output power requires the replacement of one or more of the component fiber lasers with a component fiber laser of higher power. Replacing component fiber lasers is expensive, particularly since there is attendant with it limited or no re-use of the replaced component fiber laser, subsystems, or components.

Conventional system designs are also limited with respect to how technological advances can be accommodated or incorporated since many key components are integrated into each component fiber laser. For example, pump diode technology is advancing rapidly, providing increased power, brightness, and efficiency and reduced cost. Active fibers have also experienced significant technological gains in recent years. Incorporating these advances into an existing fiber laser can be difficult or impossible if the pump diodes, fibers, and electronics are all integrated into a single laser module. For example, the interconnections among components within a single laser module would likely be inaccessible or not easily changeable, and changes to critical components would entail significant design ripple, requiring corresponding changes in the other components. Similarly, the mechanical or thermal designs could be impacted by changing a critical component. Thus, conventional high power fiber laser architectures often must either forgo upgrades based on technological advances or commit to costly and time consuming redesign.

A need therefore exists for a multi-kilowatt fiber laser architecture that minimizes cost by eliminating component redundancy, minimizes or eliminates the drawbacks of signal combiners, is easily and cost-effectively serviceable in the field, enables field upgradability, and is sufficiently flexible to accommodate technological advances without significant cost or design ripple.

SUMMARY

According to one aspect of the present invention, a modular and scalable high power fiber laser system configurable to generate 1 kW or more of laser output includes one or more separable pump modules separately disposed from each other, each pump module including a plurality of fiber-coupled component pump sources optically combined by one or more fiber-based pump module pump combiners, each pump module providing one or more pump module fiber outputs, and a gain module separately disposed from the one or more separable pump modules and including one or more gain module pump fiber inputs optically coupled to corresponding ones of the pump module fiber outputs, and including a gain fiber optically coupled to the one or more gain module pump fiber inputs, the gain fiber configured to generate a gain module fiber output power scalable in relation to the number and power of the pump module fiber outputs coupled to the gain fiber.

According to another aspect of the present invention, a high-power fiber laser system includes a gain module configured to generate an output beam of 1 kW or greater at an output beam wavelength, and one or more pump modules optically coupled to the gain module and configured to generate light at a pump wavelength for optically pumping the gain module, wherein the gain module is configured to receive pump light from the one or more pump modules such that the power of the output beam is scalable in accordance with the number and power of pump modules coupled to the gain module.

The foregoing and other objects, features, and advantages will become apparent from the following detailed descrip-

BRIEF DESCRIPTION OF THE DRAWINGS

FIG. 3A is a schematic of a pump module of a fiber laser system in accordance with an aspect of the present invention.

FIG. 3B is a schematic of a pump module of a fiber laser system in accordance with an aspect of the present invention.

FIG. 4 is a schematic of another pump module of a fiber laser system in accordance with an aspect of the present invention.

DETAILED DESCRIPTION

Figure 1A:
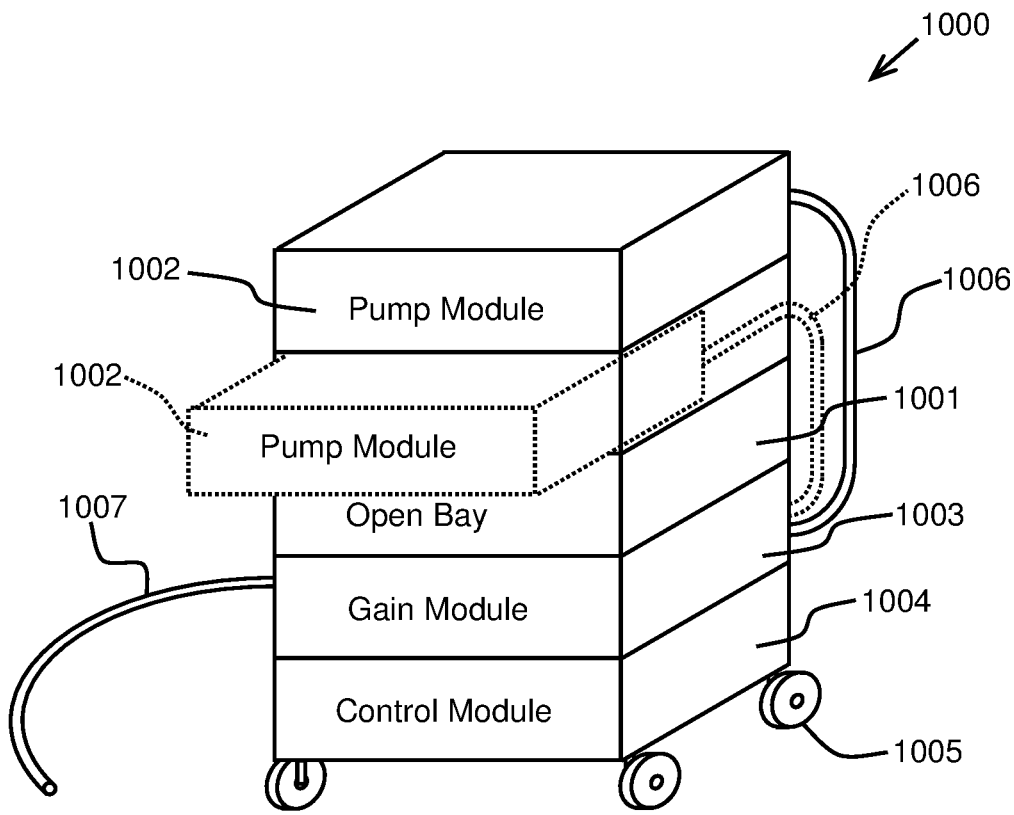
FIG. 1A is a perspective view of a fiber laser system in accordance with an aspect of the present invention.

A perspective view of a first embodiment of a highly configurable, modular, and scalable continuous-wave or quasi-continuous-wave high-power fiber laser system 1000 is shown in FIG. 1A. The fiber laser system 1000 includes several bays 1001 which modularly receive different system modules, including system pump modules 1002 and system gain modules 1003, each which can be configured to be separable from the fiber laser system 1000. Additional modules, such as a control module 1004 or a power supply module, also can be modularly disposed in relation to the other system modules of the system 1000. The scalable multi-kilowatt fiber laser system 1000 is depicted in an optional mobile configuration, with a plurality of system modules disposed in a vertical rack arrangement mounted atop a plurality of casters 1005 for convenient movement in an industrial environment. Pump modules 1002 provide one or more pump module fiber outputs 1006 which are optically coupled to one or more gain modules 1003. Fiber laser system 1000 includes a system output 1007 providing about 1 kW or more of output power for various industrial applications and which can be provided by the one or more gain modules 1003. Output power of the system can be scaled by adding additional pump modules 1002 in available system bays 1001 or by upgrading installed pump modules 1002 by swapping old with new.

The modularity and scalability of embodiments herein present numerous manufacturing advantages. For example, many different power levels can be selected without requiring significant redesign between the selected power level configurations. A configuration with a single pump module 1002 and a single gain module 1003 can provide a particular system output power which can be upgraded by installing an additional pump module 1002 (see pump module 1002 shown in dashed lines in FIG. 1) and splicing the pump module output 1006 to the gain module 1003. Due to the modularity, size and weight can be divided between pump and gain modules such that a single person in the field or factory can carry, implement, or service each pump and gain module of the system. This advantage can be particularly significant as the power from a single fiber laser is increased, which has been a consistent trend in the industry; this power scaling trend can continue without resulting in prohibitively large or heavy modules because the pump modules and gain modules do not have to be housed in a single module. The form factor of the laser system can also be configured to support different deployment scenarios. For example, system modules can be mounted in a rack vertically as shown in FIG. 1, horizontally, or in another orientation, or combination thereof. Modules can be physically separated from each other to facilitate integration into a desired space.

Figure 1B:
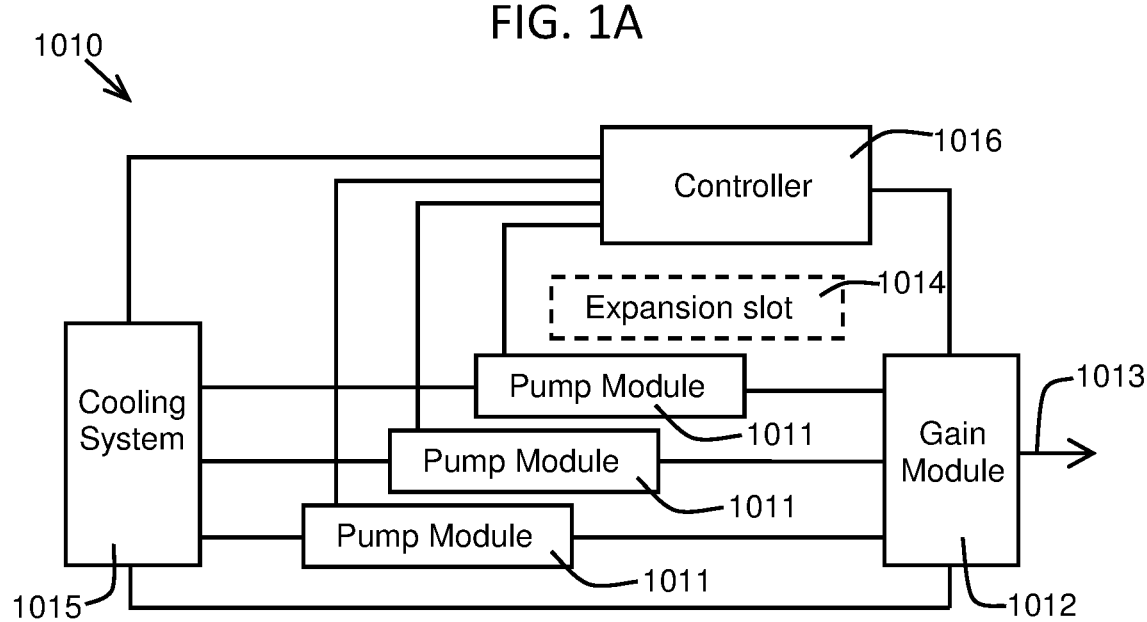
FIG. 1B is a connectivity diagram of the fiber laser system depicted in FIG. 1A in accordance with an aspect of the present invention.

In FIG. 1B a schematic is shown for an embodiment of a system 1010 similar to that shown in perspective view in FIG. 1A. The system 1010 includes a plurality of pump modules 1011 providing pump energy to a gain module 1012 which is configured to generate a laser system output 1013. The system 1010 can include one or more expansion slots 1014 to provide configuration changes to the system 1010, such as additional pump or gain modules. A cooling system 1015 is coupled to the pump and gain modules to provide thermal stability therein and to the system 1010 as a whole. The system 1010 is controlled by a controller 1015 configured to monitor and adjust outputs and other properties of the pump modules, gain modules and cooling system.

Figure 2:
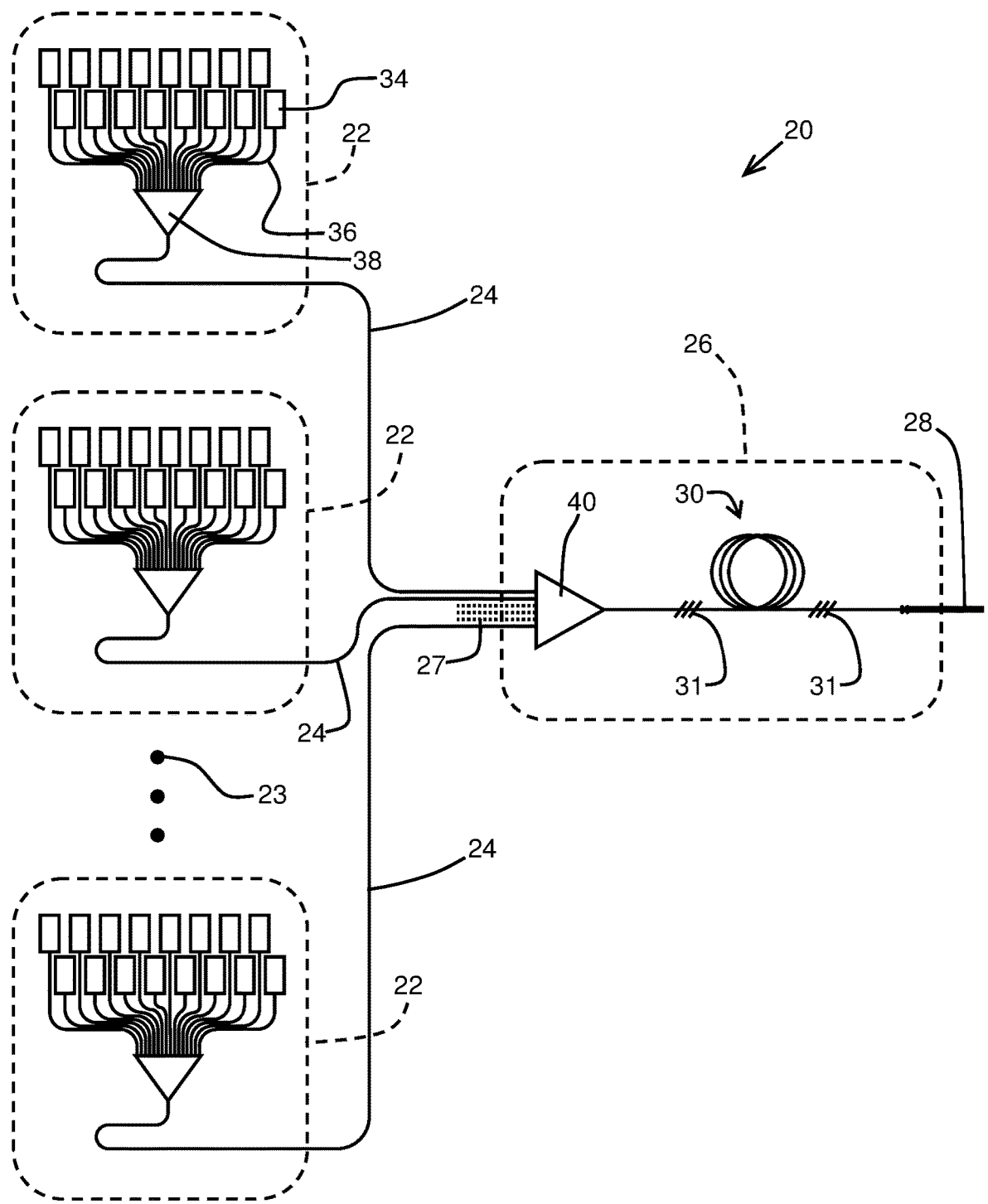
FIG. 2 is a plan view schematic of a fiber laser system in accordance with an aspect of the present invention.

Referring now to FIG. 2, an embodiment of a high power fiber laser system 20 is shown, in accordance with another aspect of the present invention. The fiber laser system 20 is highly configurable and modular such that the system 20 can be manufactured ab initio for operation at a pre-selected range of output powers, such as between 1 kW or less and multiple KWs, and for upgrade to higher output powers or different performance criteria. The fiber laser system 20 includes one or more component pump modules 22 each separately disposed from the other and modularly separable from the system 20. Each component pump module 22 provides one or more component pump module outputs 24. The fiber laser system 20 also includes one or more gain modules 26 separately disposed from each other and modularly separable from the system 20. The one or more gain modules 26 are optically coupled to the one or more component pump module outputs 24, such that a fiber laser system output beam 28 is produced at a predetermined output power. In the example shown in FIG. 2, a single gain module 26 provides the system output beam 28 by utilizing the pump power of three pump modules 22 coupled to the gain module 26. Slots for additional modularly separable pump modules 22 are shown with spots 23 while corresponding additional pump module outputs for coupling to the gain module 26 are shown with dashed lines 27.

Gain module 26 includes a gain fiber incorporated into a laser oscillator 30 providing laser oscillation between opposite fiber Bragg gratings 31. In some examples, the gain fiber of the gain module 26 includes optical fiber sized to accommodate a predetermined highest output power for the fiber laser system 20. For example, in some embodiments selected maximum operating output powers are in the kW range, such as 1 kW, 2 kW, 3 kW, 4 kW, 5 kW, or higher. The maximum output power of the fiber laser system 20 is determined by the number and output power of pump modules 22 capable of being spliced to the gain module 26. Thus, the fiber laser output beam 28 can be produced without using a plurality of redundant oscillator or amplifier systems, without redundant supporting mechanical and electrical components, and without using a signal combiner to combine a plurality of redundant component fiber laser outputs.

The separate and modular nature of the pump and gain modules 22, 26 allows each to be serviced separately. For example, if a fiber failure occurs in the gain module 26, the gain module 26 can be replaced while each of the installed pump modules remains intact without any or substantial modification. Similarly, if a pump module 22 fails in some fashion, the pump module 22 can be replaced, leaving each other pump module 22 and the gain module 26 in place without any or substantial modification thereof. Systems herein provide robustness advantages as potential failures are more likely to be isolated to particular system modules, which can be interchanged and upgraded without replacing an entire system.

In preferred examples, a pump module 22 includes one or more semiconductor diode laser modules 34 each including one or more semiconductor diode lasers providing one or more diode laser output beams combined and coupled to a diode laser module output optical fiber 36. A plurality of output optical fibers 36 are optically coupled to a pump module pump combiner 38 to combine the diode laser module pump light into a pump module output 24. Pump module pump combiners 38 are configured to transmit low-brightness multimode pump light in a large core, as opposed to signal combiners, which transmit high-brightness signal light in a small core. Pump combiners are often manufactured at less cost than signal combiners since the performance requirements, such as beam quality at the combiner output and optical insertion loss, are typically less demanding.

Combined pump light is coupled out of the pump module 22 through one or more pump module outputs 24. The pump module outputs 24 are optically coupled (e.g., by fiber splicing) to the gain module 26 onto a fiber combiner 40 thereof. The fiber combiner 40 can be the similar in design to the pump module pump combiner 38 associated with each pump module 22. However, in preferred examples, the combiner in the gain module can be a pump-signal combiner, which transmits both signal and pump light. As will be described further hereinafter, pump-signal combiners can be used at a back end of the gain module gain fiber, at a front end of the gain fiber to launch counter-propagating pump light, within or between gain stages (e.g., between an oscillator and an amplifier or between amplifiers), or some combination thereof. In various examples herein, since the performance requirements of the fiber splices between the pump and gain modules are often lower than those for splices that must transmit signal light (e.g., between a component fiber laser and a signal combiner in conventional designs), splicing requirements are relaxed concomitantly, allowing for in situ splicing of the pump module outputs 24 to selected gain module inputs of the fiber combiner 40 under less than clean-room conditions using commercially available equipment. Alignment sensitivity and cleave-angle requirements are lower for splicing outputs 24 to fiber combiner 40 as compared to the splicing of fibers to signal combiners, also contributing to the accessibility of splicing fibers to the fiber combiner 40 in a factory or other field environment. For glass-clad fibers, splicing of the pump module outputs 24 to the fiber combiner 40 is insensitive to contamination and consequently suitable for use in field and factory environments. In some examples, pump module outputs 24 are coupled to gain module 26 via connectors pluggable into the pump module or the gain module or both, eliminating the need for splicing and further enhancing modularity of the fiber laser system.

In addition to enhancing the field serviceability of the fiber laser system 20, the modular separation of the pump modules and gain module allows for field upgradability of the system 20 to higher allowable output powers. For example, additional pump modules 22 can be spliced to open pump fiber inputs of the fiber combiner 40 of the gain module. Additional pump modules 22 can be identical to or different from existing modules 22 spliced to the gain module 26 such that laser output 28 of the system 20 can be selectably scaled to higher powers. Similar to servicing an existing system 20, the procedure for splicing the pump module outputs 24 of the additional pump modules 22 to the fiber inputs of the fiber combiner 40 is relatively simple and can be performed in a factory or other field environment. The modular separation between pump modules and gain module also allows for scalable power output of the system 20 because the physical separation between pump modules and between the gain module and pump modules reduces or eliminates thermal crosstalk between modules. Each module can be provided with independent water-cooling ports such that modules can be cooled separately or cooled together in parallel or in series. In one example high power fiber laser system built in accordance with aspects of the present invention a 3 kW fiber laser output power can be generated with three 1.5 kW pump modules being spliced to the gain module. In another example, building or upgrading the fiber laser system to have three 2.0 kW pump modules can provide a 4 kW fiber laser output power. In some examples, one or more backup pump modules can be provided in the fiber laser system 20 for use in the event of the failure of another pump module. The system 20 can be configured to switch over to the backup pump modules immediately upon failure, or slowly as one or more other active pump modules degrade over a period of time. The separable nature of the pump modules further allows for failed modules to be replaced in situ with new pump modules without affecting the operation of the backup pump modules or fiber laser system.

In addition to field serviceability and field power expandability, the modularity of system 20 provides for adaptability to various technology improvements, ensuring compatibility of the system 20 and its existing modules with the pace of innovation in the laser industry. For example, improvements in pump diode technology could provide for an upgraded pump module 22. The upgraded pump module can be substituted for an existing pump module 22 or can be used in addition to existing pump modules 22, providing improved system performance, efficiency, cost, or any combination thereof, without requiring significant design changes or replacement of components that have not been upgraded. Similarly, improvements in gain module technology such as oscillator or amplifier architecture might provide for an upgraded gain module 26. The upgraded gain module can be substituted for the existing gain module 26 without requiring replacement or modification of the pump modules. The various substitutions can again be performed in the field or factory environment.

In many industrial applications for kW fiber lasers, single-mode output beam quality is not required. Accordingly, conventional architectures typically combine the outputs of fiber lasers producing single-mode signal beams using a signal combiner to produce a multimode output beam. In some examples of fiber laser system 20, the gain module 26 does not produce single-mode output since such output is not required for many applications. Because the desired output is multimode, systems 20 can achieve such output without the need for the complexity of single-mode combination. Also, because single-mode operation of the gain module 26 is not required, the ability to scale the power of the gain module 26 to multiple kW outputs is more accessible. Allowing the gain fiber of the gain module 26 to be multimode facilitates power scaling in a more practical manner than by maximizing the single-mode output power of an individual fiber laser since the single-mode power limit is lower than the multimode power limit. Single-mode fiber lasers are typically limited to a power level of around 1-2 kW, resulting in the requirement that multiple fiber lasers be combined in order to reach multiple kW power levels; approaches to scaling the single-mode power beyond this level typically entail cost, complexity, and/or inefficiency that are undesirable for an industrial laser system.

In other embodiments, a single-mode system output may be desirable, and gain module 26 can be configured for single-mode output. A single-mode gain module 26 is typically rated at a lower output power than counterpart systems with multimode outputs. However, the modularity of the architecture of the system 20 allows a multimode gain module to be swapped with a single-mode gain module. In one example, a single-mode gain module can be rated for an output of 1 kW while a multi-mode gain module can be rated for an output of 3 or 4 kW.

In typical examples of gain module 26, beam quality of the output beam 28 is generally dependent upon the maximum power rating of the gain module such that higher power ratings for gain module 26 generally correspond with a lower beam quality for output beam 28. Some particular examples of gain modules 26 can be rated at a maximum power rating higher than other particular examples of gain modules 26, and for the same output level the higher rated module will provide an output beam 28 of lower beam quality than the output beam 28 with the lower power rated module. However, in fiber laser system examples herein that do not utilize fused signal combiners such that undesirable beam quality degradation in the output beam 28 is correspondingly avoided, a higher power rated gain module 26, configured to receive multiple pump module outputs 24, is made possible. Thus, provision for receiving a plurality of pump module outputs 24 in the gain module 26 does not represent a significant beam quality compromise for system 20 configured for multiple kW power output and may provide better beam quality than a system with similar output power based on combining the outputs of single-mode fiber lasers.

Conventional kW fiber laser systems for industrial materials processing applications typically provide a beam parameter product (BPP, a standard measure of beam quality) of 2.3-3.0 mm-mrad at a power level of 2-4 kW, and the BPP is generally larger (i.e., worse beam quality) at higher powers. By eliminating the signal combiner according to various aspects of the present invention, an output with a higher beam quality is possible. For example, with presently available pump diodes, a beam quality of less than about 1 mm-mrad is possible at 2 to 3 kW and less than about 2 mm-mrad is possible at 4 to 5 kW.

Modular pump modules can be provided in a variety of selectable configurations. With reference to FIG. 3A, a pump module 42 is shown that includes a plurality of semiconductor diode laser modules 44. Diode laser modules 44 are fiber-coupled such that the diode laser light generated in the laser module 44 is directed into an output optical fiber 46. The plurality of output optical fibers 46 are combined with a fused-fiber pump combiner 48. Combiners are typically made of glass and are tapered or fused to collapse multiple optical fiber inputs to fewer or one optical fiber output. The light coupled into the combiner 48 is combined and directed into a pump module output 50. Different types of diode laser modules 44 may be used, which can provide different levels of laser beam brightness or irradiance, as well as power output. Consequently, in some examples, fewer of a particular type, more of a particular type, or different types of diode laser modules 44 may be used to achieve the same desired power output of the pump module 42. With combiner 48 the plurality of output optical fibers 46 is combined in a single stage to provide a pump module output 50, which can be polymer-clad or glass-clad or both, for subsequent optical coupling to a gain module (not shown). In FIG. 3B, a pump module 43 is shown that includes a single semiconductor diode laser module 45. Diode laser module 45 provides a sufficient amount of optical pumping power for coupling into a pump module output 50 without requiring the use of a pump combiner to combine multiple diode laser modules in the pump module.

Referring to FIG. 4, another example is shown for a pump module 52 employing a plurality of diode laser modules 54 in a multi-stage combiner configuration. The diode modules provide fiber-coupled outputs 56 which are combined with first-stage pump fiber combiners 58. The combiners 58 provide first-stage combiner outputs 60 which are then coupled in a second-stage pump combiner 62. Second-stage pump combiner 62 may be the same or similar to first-stage combiner 58 depending on the brightness, power, or other requirements and characteristics of the multi-stage pump module 52. The light coupled into the second-stage combiner 62 is combined and provided as a pump module output 64, which can be polymer-clad or glass-clad or both, for subsequent optical coupling to a gain module (not shown).

Figure 5:
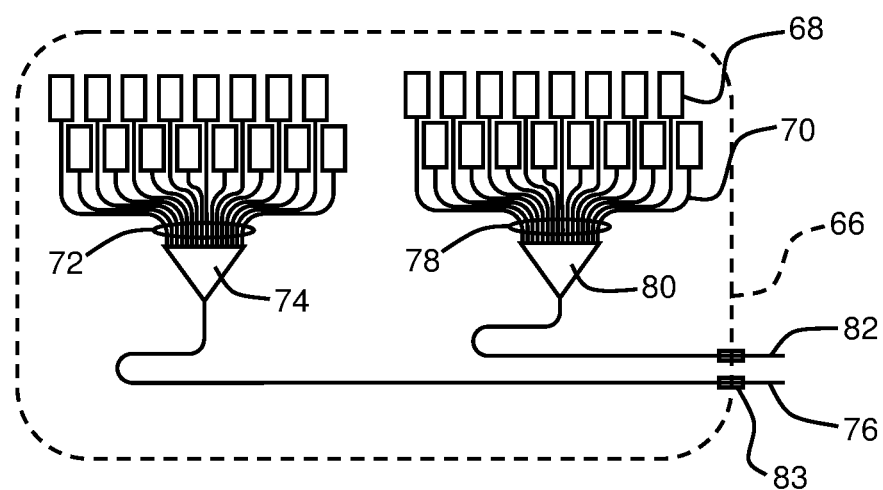
FIG. 5 is a schematic of another pump module of a fiber laser system in accordance with an aspect of the present invention.

In FIG. 5 another embodiment of a pump module 66 is shown providing a plurality of pump module outputs. Pump module 66 includes a plurality of diode laser modules 68 providing laser pump light to respective fiber-coupled output optical fibers 70. A first set of output optical fibers 72 is coupled into a first pump combiner 74. The pump light is combined with the pump combiner 74 and directed to a glass-clad or polymer-clad (or both) first pump module output 76. A second set of output optical fibers 78 is coupled into a second pump combiner 80. The second combiner 80 combines the received pump light and directs the light to a second glass-clad or polymer-clad (or both) pump module output 82. In other embodiments, pump module 66 has more than two pump module outputs. As shown, pump outputs 76, 82 include pluggable connectors 83 at a boundary of the pump module 66. Connectors 83 can facilitate the modularity of the pump modules herein by allowing separate patch cables to be used to connect pump modules and gain modules or by simplifying connection between pump modules and gain modules. However, optical splices can also be used to connect outputs of pump module 66 to gain modules herein.

Figure 6:
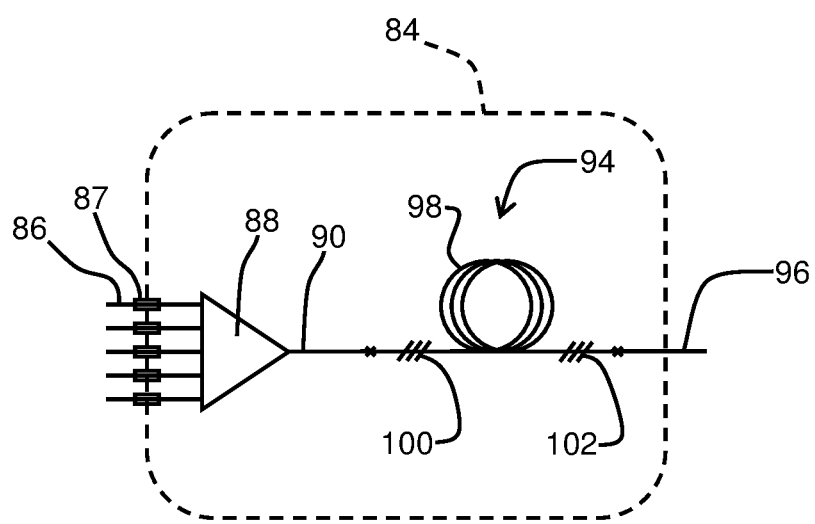
FIG. 6 is a schematic of a gain module of a fiber laser system in accordance with an aspect of the present invention.

In FIG. 6 an alternative embodiment of a gain module 84 is shown. Gain module 84 includes a plurality of polymer-clad, glass-clad, or both glass and polymer-clad pump inputs 86 which may be received from or may be the same as pump module outputs (not shown). As shown, pump inputs 86 are coupled into the gain module 84 via pluggable connectors 87, though optical splices may also be used. The pump inputs 86 are optically coupled to a gain module fused pump or pump-signal combiner 88 which combines received pump light and couples the light into gain module combiner output 90. The combined pump light of the combiner output 90 is coupled or spliced into a fiber laser oscillator 94 which converts incident pump power to a gain module output 96. The gain module output 96 can be used as a system output or it can be combined further with an additional module. The fiber laser oscillator 94 generally includes an optical gain fiber 98 in which the pump light is coupled and in which the gain module output 96 is generated, a high reflector 100 configured to reflect the laser energy to produce the output 96 and to transmit incoming pump light, and a partial reflector 102 configured to transmit at least a portion of the laser energy for output 96. The high and partial reflectors can be fiber Bragg gratings or other suitable reflective optical components.

Figure 7:
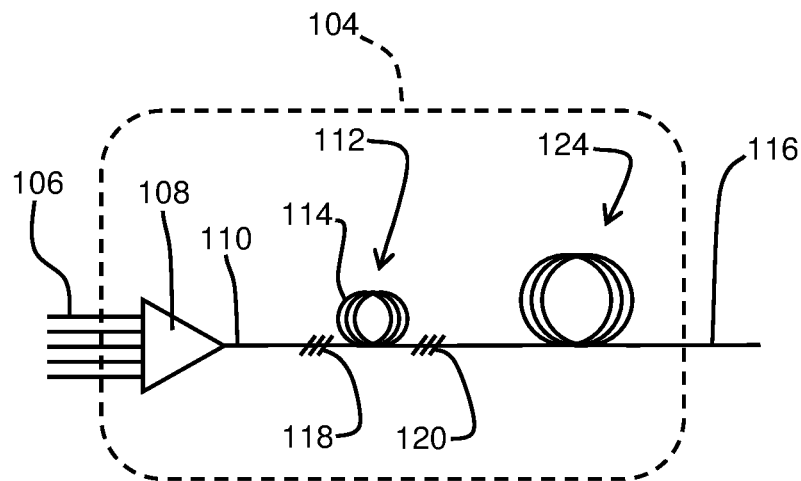
FIG. 7 is a schematic of another gain module of a fiber laser system in accordance with an aspect of the present invention.

In FIG. 7 another alternative embodiment of a gain module 104 is shown for a master oscillator power amplifier (MOPA) configuration. Gain module 104 includes a plurality of polymer-clad and/or glass-clad pump inputs 106 coupled to a gain module fused pump-signal or pump combiner 108. The combiner 108 receives pump light through the pump inputs 106 and combines and couples the beams into a combiner output fiber portion 110. The combined pump light of the combiner output 110 is coupled or spliced into a fiber laser oscillator 112 which converts a first portion of incident pump energy to signal energy for gain module output 116. The fiber laser oscillator 112 can include an optical gain fiber 114 in which the pump light is coupled and in which the signal energy of the gain module output 116 is generated, a high reflector 118 configured to reflect signal energy and to transmit incoming pump energy, and a partial reflector 120 configured to transmit at least a percentage of the signal energy. A first amplifier 124 receives the signal light and amplifies the power thereof with pump light energy. In other embodiments, one or more additional amplifiers can be added in sequence after first amplifier 124 to vary the maximum power rating and beam quality of the gain module output 116.

Figure 9:
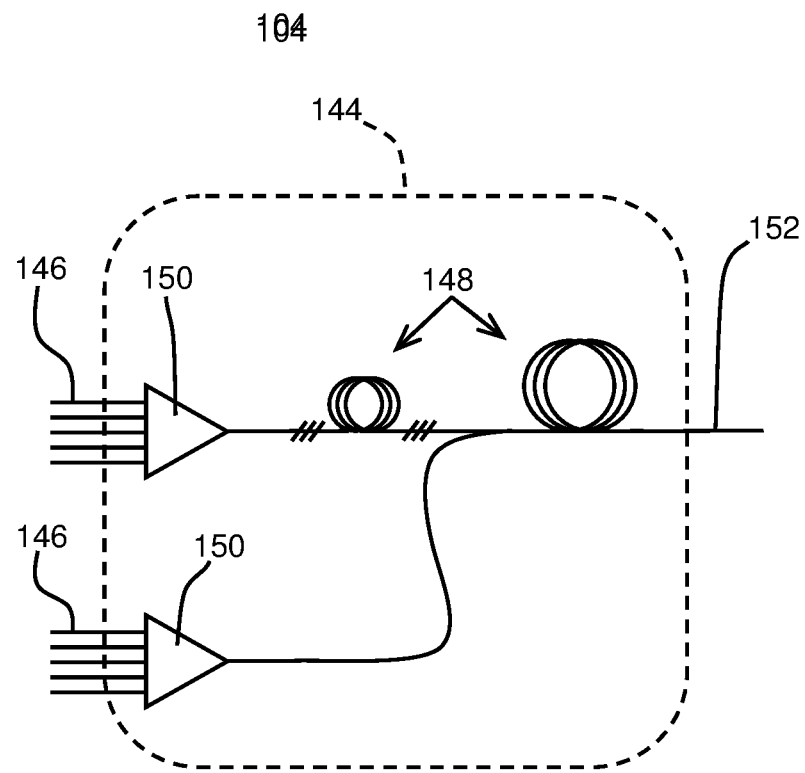
FIG. 9 is a schematic of another gain module of a fiber laser system in accordance with an aspect of the present invention.

In another embodiment of a gain module 144, shown in FIG. 9, the output fibers 146 from one or more pump modules are coupled into a gain fiber 148 using one or more pump-signal combiners 150 at one or more positions along the gain fiber 148 to provide side-pumping therein in order to produce a gain module signal output 152. The one or more pump-signal combiners 150 can be used in connection with gain fiber 148 in an oscillator configuration, such as the oscillator shown in FIG. 6, or a MOPA configuration as shown in FIG. 7. The combiners 150 can be used to couple light into the gain fiber 148 at various positions, including between the high reflector and the oscillator fiber, between the oscillator and amplifier fibers, between amplification stages, or some combination thereof. Moreover, pump light can be launched in the direction of the signal beam in a co-propagating manner, in the direction opposite the signal beam, i.e., in a counter-propagating manner, or both. In some examples providing side-pumping, a plurality of gain fibers 148 are disposed in the gain module in parallel so as to produce more than one gain module output 152. Similarly, it will be appreciated that for other various gain module embodiments herein a plurality of gain fibers can also be disposed therein in parallel so as to produce a plurality of gain module outputs.

Figure 10:
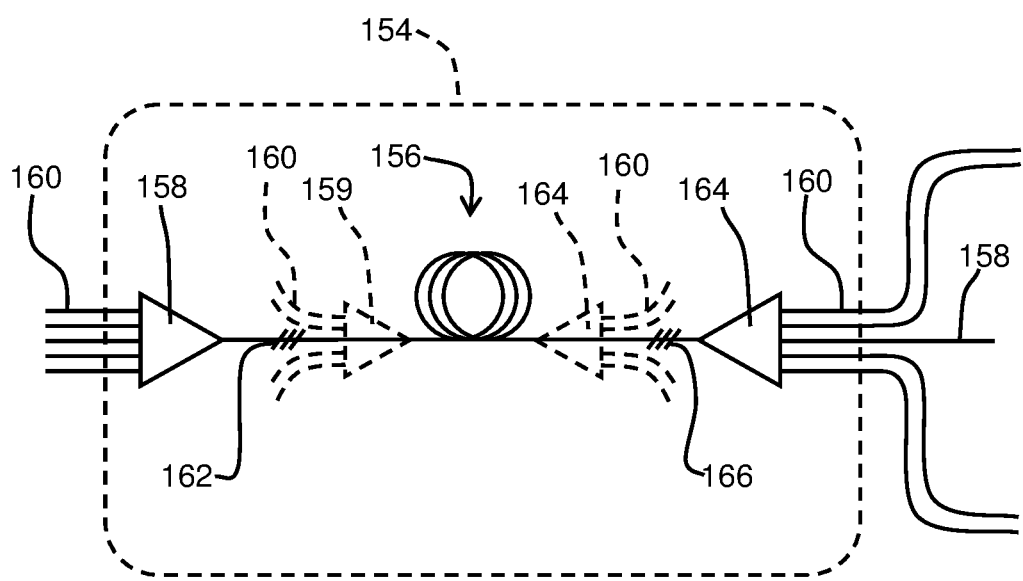
FIG. 10 is a schematic of another gain module of a fiber laser system in accordance with an aspect of the present invention.

In another embodiment of a gain module 154, shown in FIG. 10, an oscillator 156 is bi-directionally pumped to produce a gain module output 158. Pump light from one or more pump modules is launched via gain module input fibers 160 in the co-propagating direction using a combiner 158 such as a pump or pump-signal type before a high reflector 162 of the oscillator or a combiner 159 such as a pump-signal type between the high reflector 162 and the oscillator. In addition, pump light from one or more pump modules is launched in the counter-propagating direction using a pump-signal combiner 164 such as between the oscillator and a partial reflector 166 thereof or after the partial reflector.

Figure 8:
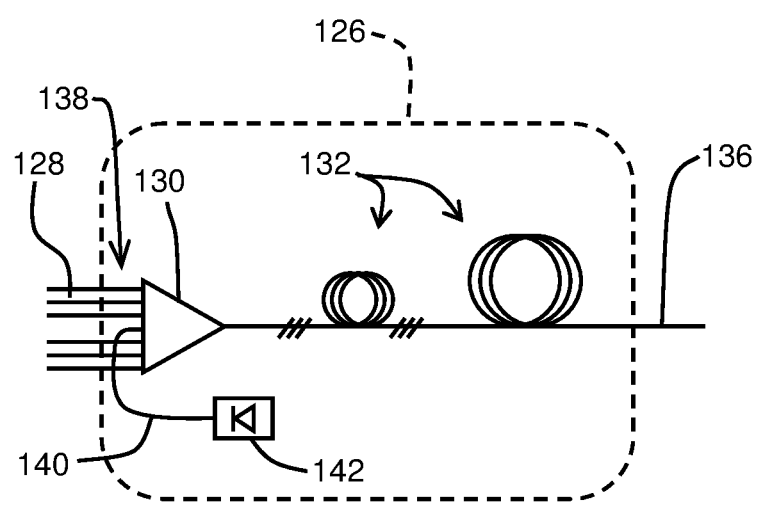
FIG. 8 is a schematic of another gain module of a fiber laser system in accordance with an aspect of the present invention.

In FIG. 8 there is shown an embodiment of a gain module 126 that includes a plurality of polymer-clad and/or glass-clad pump inputs 128, a gain module combiner 130 optically coupled to the inputs 128 so as to receive the pump light therefrom, and one or more gain fiber gain stages 132, such as oscillator and amplifier stages, coupled to the gain module combiner 130. The gain stages 132 receive the pump light and are operable to generate and amplify a signal beam to be provided at an output 136 of the gain module 126. As shown, an even or odd number of pump inputs 128 (in this case an even number of six inputs forming a 7×1 combiner) are coupled to the inputs 138 of the gain module combiner 130. A central polymer-clad and/or glass-clad input 140 is coupled to the combiner input 138. The central input 140 is optically coupled to an aiming laser 142, which directs a beam through the combiner 130, gain stages 132, and output 136 to provide an aiming beam that can be used to indicate the direction of a beam emitted from the output 136 of the gain module; the aiming beam is typically visible to the unaided eye, such as a red or a green wavelength.

Figure 11:
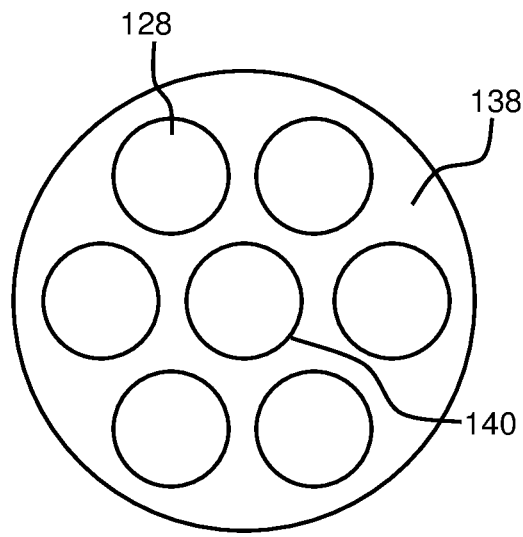
FIG. 11 is a rear view of a gain module combiner of a fiber laser system in accordance with an aspect of the present invention.
Figure 12:
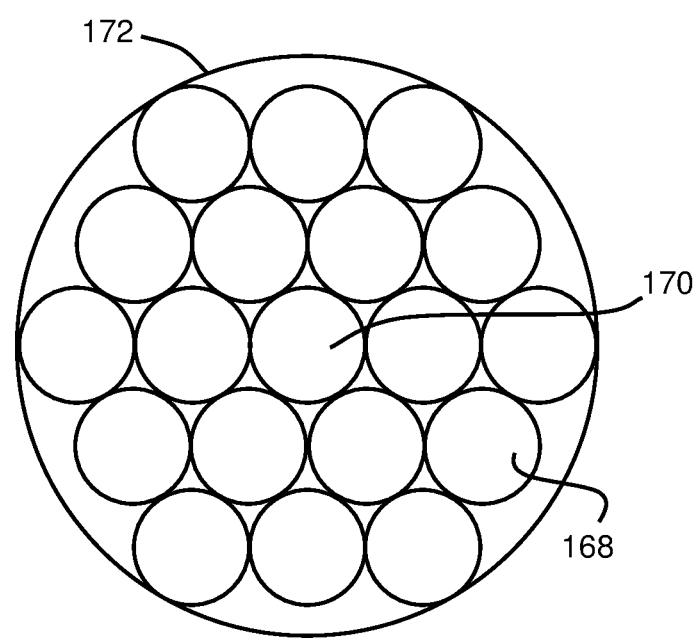
FIG. 12 is a rear view of another gain module combiner of a fiber laser system in accordance with an aspect of the present invention.

FIGS. 11 and 12 illustrate example arrangements of pump inputs received by various gain modules and coupled to combiners therein. FIG. 11 shows the arrangement on the combiner depicted in FIG. 8 where an even number of six pump inputs 128 are coupled to the input 138 around a central input 140 which can be an aiming laser input or another pump input. In FIG. 12 an arrangement of nineteen inputs 168 is shown, including a central input 170, coupled to a combiner 172. The central input 170 can be used for pumping or an aiming beam. In other examples, such as pump-signal combiner examples described herein, the central inputs can be dedicated to signal propagation. In various combiner examples herein, unused gain module combiner inputs can be paired and conveniently spliced together in the gain module for storage and future use and splicing of additional pump modules or after removal of pump modules. The spliced inputs can also recirculate pump light and signal light back through the gain module, potentially increasing gain module efficiency. Through recirculation, light that should otherwise be managed and heat sunk at the termination of the unused pump input can be redirected to designed heat sinking locations, for example, via one or more cladding light strippers, where supporting thermo-mechanical systems are configured to handle and remove the heat load.

Figure 13:
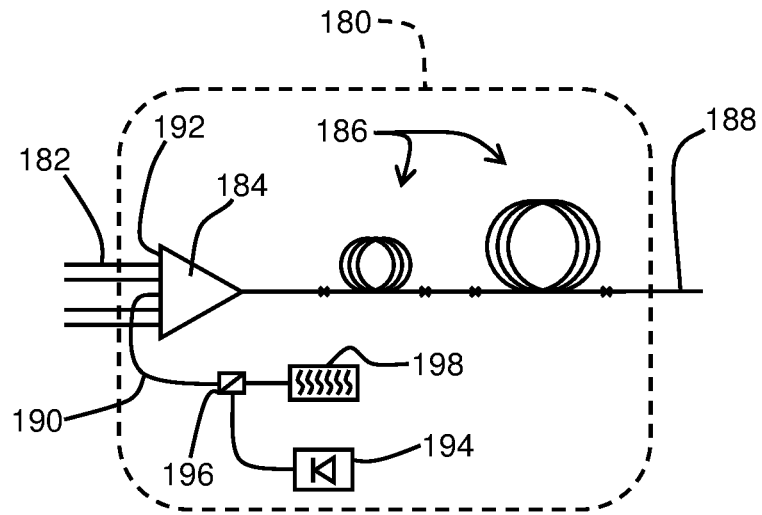
FIG. 13 is a schematic of another gain module of a fiber laser system in accordance with an aspect of the present invention.

In FIG. 13 another exemplary embodiment of a gain module 180 is shown that includes a plurality of pump inputs 182, a gain module combiner 184 optically coupled to the inputs 182, and one or more gain stages 186 coupled to the gain module combiner 184 and which produce a gain module output 188. A central polymer-clad and/or glass-clad fiber input 190 is coupled to a central location of an input 192 of the combiner. An aiming laser 194 is coupled to the central pump input 190 directly or with a beam-splitter 196. A beam dump 198 is also coupled to the central pump input 190 and is configured to receive, monitor, and heat sink or otherwise dispose of undesirable backward-propagating light from the gain module gain fiber. For example, light reflected at a target can become back-coupled into the gain module 180 through the output 188 thereof and cause damage to the one or more gain stages 186 or other components such as upstream pump modules.

Thus, it will be appreciated that some examples herein provide particular advantages over conventional approaches to configuring high power continuous-wave or quasi-continuous-wave fiber lasers in industrial settings. Herein, fiber laser power levels of 1 kW or more are achievable in a scalable and modular way such that multiple kilowatt output power can be selectably obtained. Pump sources become separated from the gain fiber and corresponding gain stages, improving serviceability, manufacturability, and field upgradeability and to take advantage of future advances in various component technologies. Variable pump module populations and ease of adjusting population enhances system flexibility and upgradeability in system output power.

Figure 14:
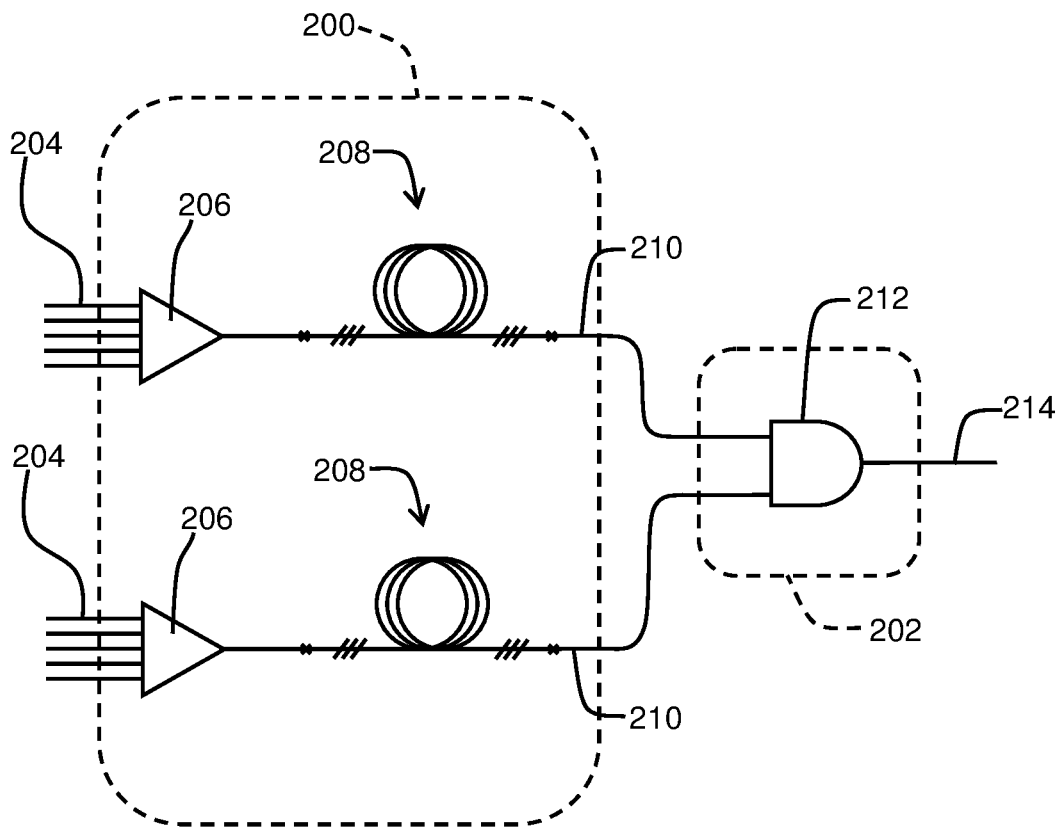
FIG. 14 is a schematic of a combiner stage in accordance with an aspect of the present invention.

In further examples, with reference FIG. 14, a gain module 200 and a combining module 202 are shown. The gain module includes two or more sets of pump inputs 204, each set coupled to a corresponding gain module combiner 206, and each combiner coupled to a corresponding one or more gain fiber gain stages 208. The separate sets of components can be configured to produce a plurality of gain module outputs 210 each with kW to multi-kW output levels. The separate multiple gain module outputs 210 can be used for various direct applications, or they can be coupled to combining module 202. The combining module utilizes a signal combiner 212 that can be modularized to be separate from gain module 200 or the signal combiner 212 thereof can be included instead as part of the gain module 200. The internal or external signal combiner 212 can be used to combine the various single-mode or multimode outputs 210 from the gain module 200 to produce a combined fiber output 214 capable of providing a very high power output beam in the multiple kW regime. For example, average power outputs of 4 kW, 6 kW, 8 kW, 10 kW, 12 kW or even higher can be achieved. In additional examples, separate gain modules can provide single gain module outputs that can be combined in combining stage 202 internal or external to gain module 200.

Figure 15:
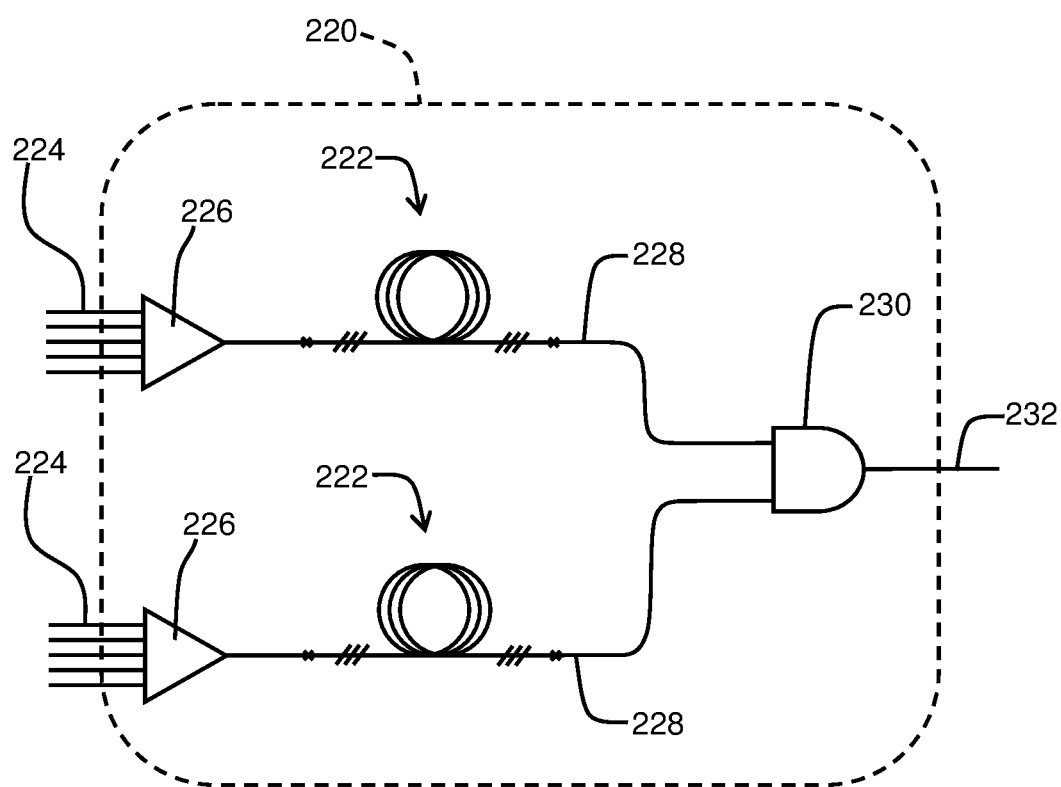
FIG. 15 is a schematic of another gain module of a fiber laser system in accordance with an aspect of the present invention.

In further examples, with reference to FIG. 15, a gain module 220 is shown that includes a pair of gain fibers 222 end-pumped by a plurality of pump inputs 224 coupled to the respective gain fibers 222 with combiners 226. High-power multimode or single-mode gain fiber outputs 228 are coupled into a signal combiner 230 that combines the high-power gain fiber outputs 228 into a single high-power output 232 of the gain module 220. In one example, gain fiber outputs provides optical powers of 4 kW respectively that are combined with the signal combiner 230 to provide a gain module output of about 8 kW. It will be appreciated that various output powers or ranges of output powers can be provided for gain module 220 by varying the number and type of scalable pump modules and pump inputs thereof coupled to the gain module 220 and also by varying the architecture of the gain module in accordance with the various embodiments and teachings herein. It is thought that the present invention and many of the attendant advantages thereof will be understood from the foregoing description, and it will be apparent that various changes may be made in the parts thereof without departing from the spirit and scope of the invention or sacrificing all of its material advantages, the forms hereinbefore described being merely exemplary embodiments thereof.

What is claimed is:

1. A fiber laser, comprising:
a combiner including a plurality of peripheral input fibers and a central fiber, the combiner optically coupled to an output fiber comprising a first central core;
one or more gain stages coupled to the output fiber; and
a beam dump optically coupled to the central fiber;
wherein an aiming laser is coupled to the central fiber.

2. The fiber laser of claim 1, wherein the aiming laser is coupled to the central fiber via a beam-splitter disposed between the beam dump and the aiming laser.

3. The fiber laser of claim 1, wherein the beam dump is configured to receive and monitor, heat sink or a combination thereof, backward-propagating light.

4. The fiber laser of claim 1, wherein the central fiber is glass-clad.

5. The fiber laser of claim 1, wherein the central fiber is polymer-clad.

6. The fiber laser of claim 1, wherein the plurality of peripheral input fibers are glass-clad.

7. The fiber laser of claim 1, wherein the plurality of peripheral input fibers are polymer-clad.

8. The fiber laser of claim 1, wherein the combiner is a pump-signal combiner.

9. The fiber laser of claim 8, wherein the central fiber includes a second central core.

10. The fiber laser of claim 9, wherein the beam dump is configured to receive light guided by the first central core and the second central core.

11. The fiber laser of claim 1, wherein the combiner is upstream of the gain stages.

12. A fiber laser, comprising:
a combiner including a plurality of peripheral input fibers and a central fiber, the combiner optically coupled to an output fiber comprising a first central core;
one or more gain stages coupled to the output fiber; and
a beam dump optically coupled to the central fiber;
wherein one or more pairs of peripheral input fibers are spliced together so as to recirculate back-reflected light back through the output fiber.

* * * * *